(12) United States Patent
Wosik et al.

(10) Patent No.: US 7,511,497 B2
(45) Date of Patent: Mar. 31, 2009

(54) SUPERCONDUCTING ARRAY OF SURFACE MRI PROBES

(75) Inventors: Jaroslaw Wosik, Houston, TX (US); Krzysztof Nesteruk, Warsaw (PL); Lei Ming P Xie, Houston, TX (US)

(73) Assignee: The University of Houston System, Houston, TX (US)

( * ) Notice: Subject to any disclaimer, the term of this patent is extended or adjusted under 35 U.S.C. 154(b) by 200 days.

(21) Appl. No.: 10/532,457

(22) PCT Filed: Oct. 24, 2003

(86) PCT No.: PCT/US03/33933
§ 371 (c)(1),
(2), (4) Date: Sep. 5, 2006

(87) PCT Pub. No.: WO2004/038431
PCT Pub. Date: May 6, 2004

(65) Prior Publication Data
US 2007/0013377 A1    Jan. 18, 2007

(51) Int. Cl.
*G01V 3/00*    (2006.01)

(52) U.S. Cl. .................................... 324/318; 324/322
(58) Field of Classification Search ......... 324/300–322; 600/407–422; 333/229, 235
See application file for complete search history.

(56) References Cited

U.S. PATENT DOCUMENTS

| | | | | |
|---|---|---|---|---|
| 4,535,381 | A * | 8/1985 | Rayburn | 361/308.1 |
| 6,177,797 | B1 * | 1/2001 | Srinivasan | 324/318 |
| 6,252,403 | B1 * | 6/2001 | Alsop | 324/318 |
| 6,633,161 | B1 * | 10/2003 | Vaughan, Jr. | 324/318 |
| 6,798,204 | B2 * | 9/2004 | Seeber et al. | 324/318 |
| 6,842,003 | B2 * | 1/2005 | Heid et al. | 324/318 |
| 7,268,664 | B2 * | 9/2007 | Tanaka et al. | 340/5.64 |

* cited by examiner

*Primary Examiner*—Brij B Shrivastav
(74) *Attorney, Agent, or Firm*—Robert W. Strozier

(57) ABSTRACT

An array of resonators for use in MRI and NMR is disclosed where the resonators are solid state constructs including a pair of resonating elements formed on both sides of a dielectric substrate and cooperate to form a resonator and where each resonator includes at least one discontinuity and the discontinuities on each resonating element are equally spaced and between the resonating elements are equally spaced. A probe for MRI is also disclosed which includes a source of cooling to cool the arrays therein.

25 Claims, 15 Drawing Sheets

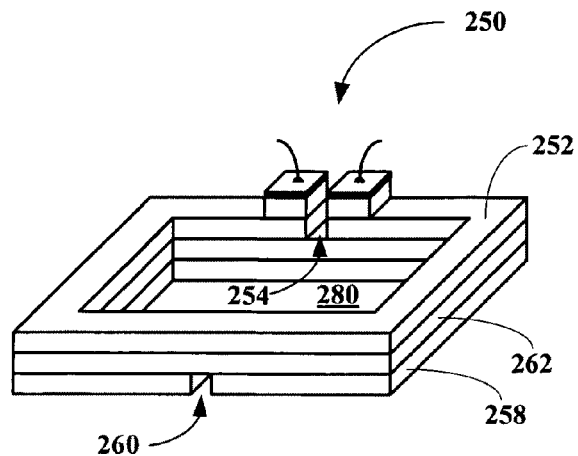
FIG. 2D
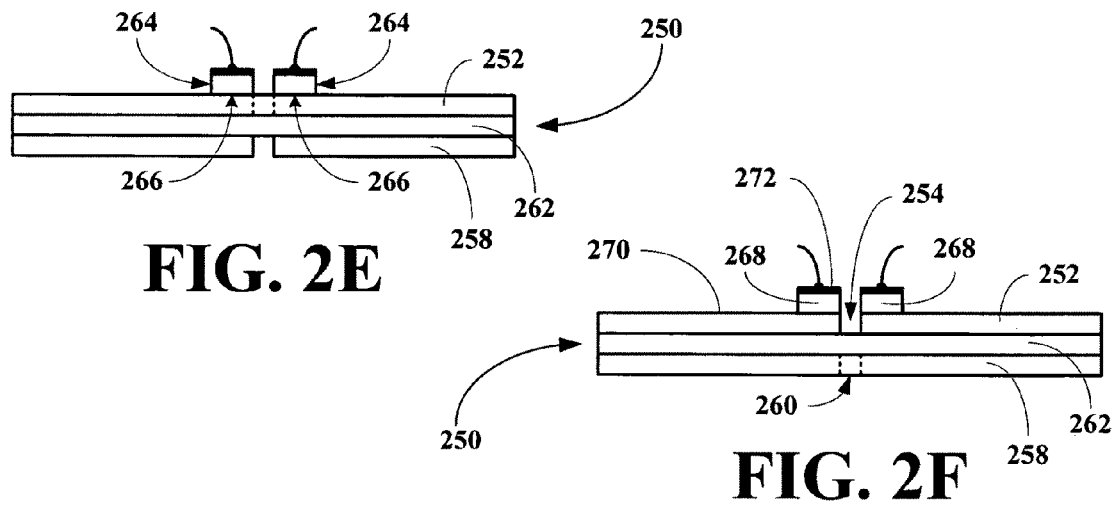
FIG. 2E
FIG. 2F
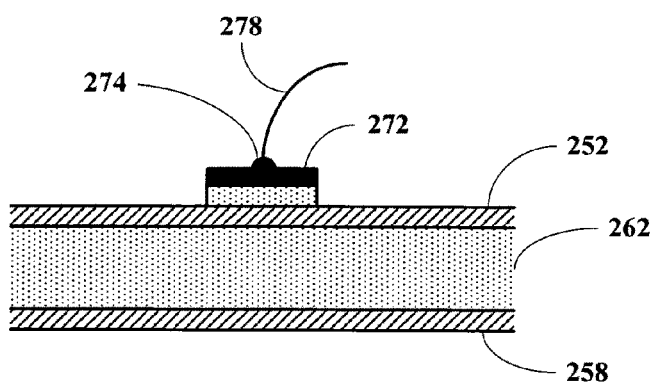
FIG. 2G

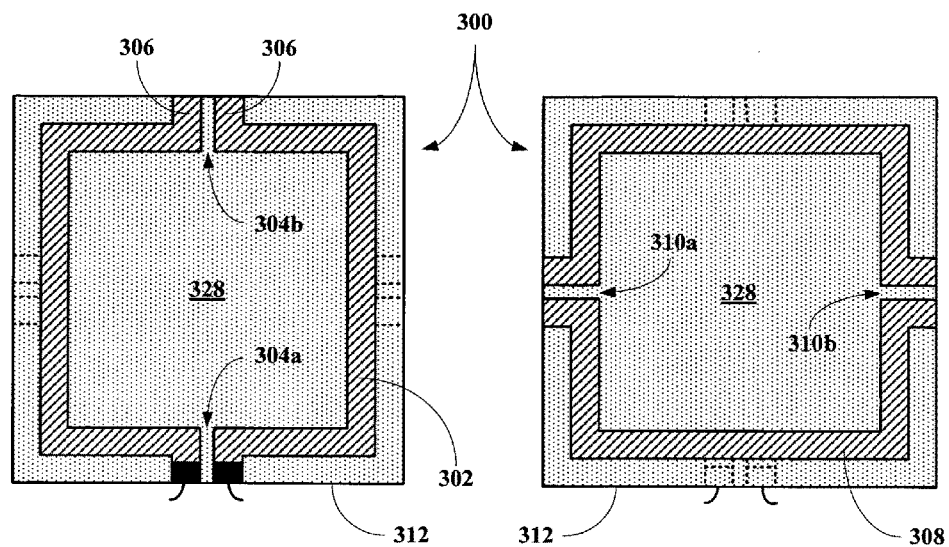
FIG. 3A          FIG. 3C
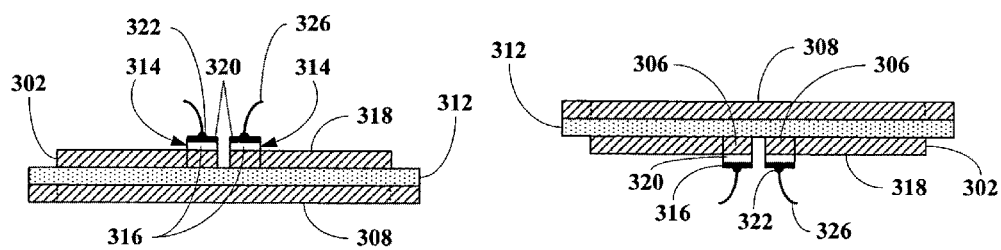
FIG. 3B          FIG. 3D

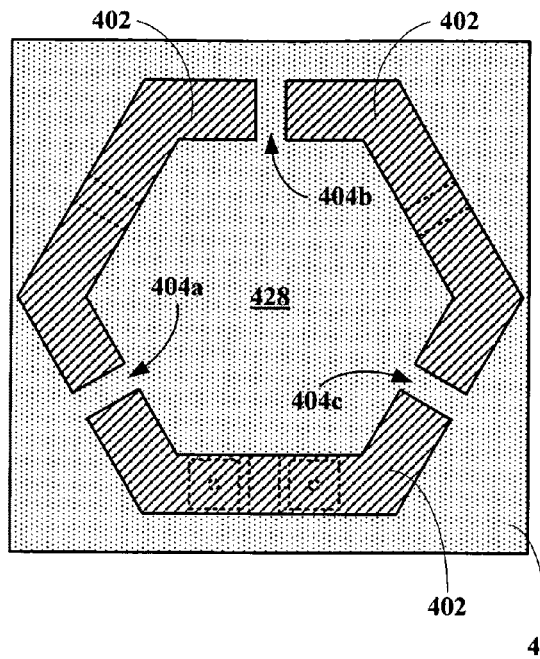
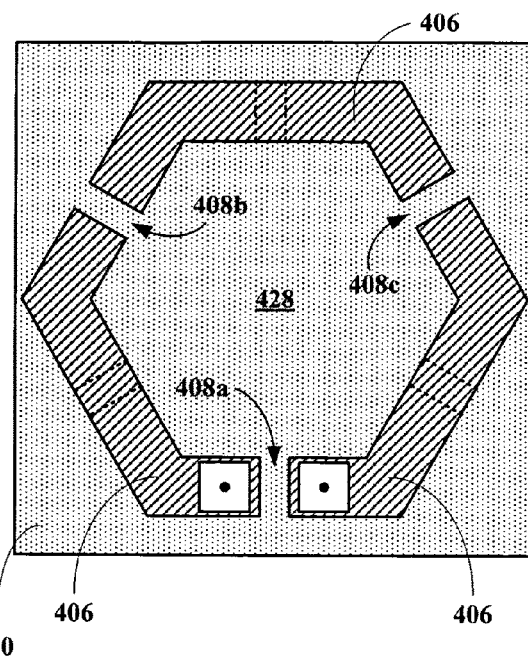
FIG. 4A
FIG. 4B
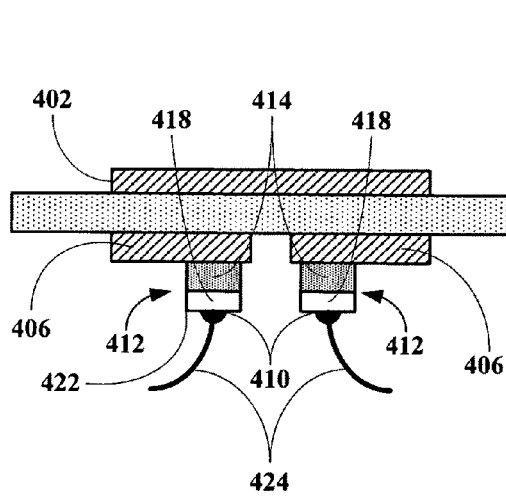
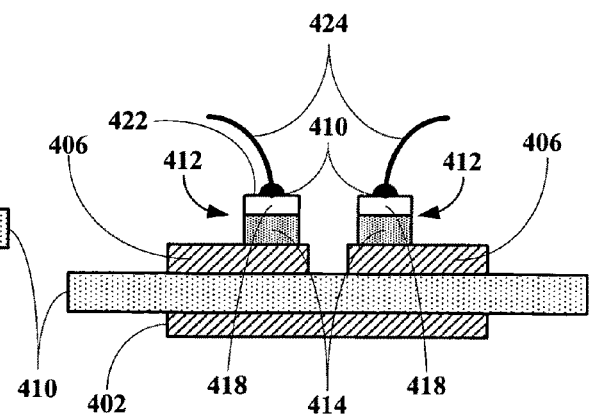
FIG. 4C
FIG. 4D

SUPERCONDUCTING ARRAY OF SURFACE MRI PROBES

BACKGROUND OF THE INVENTION

1. Field of the Invention

The present invention relates to the general field of magnetic resonance imaging (MRI) and to apparatus improving MRI data acquisition and method for making and using same.

More particularly, the present invention relates to a resonating apparatus for use in magnetic resonance imaging or related fields including a plurality of closely packed, composite resonators and a plurality of lands, tags or tabs adapted to form decoupling capacitors between nearest neighbors and optionally also diagonal neighbors, when the resonators are in an array configuration and a pair of capacitive contacts adapted to connect each resonator to a monitoring device. The present inventions also relates to a fabrication process for making the resonator arrays of this invention where all external connections and all parts of necessary decoupling capacitors are built into the basic single resonator design becoming operable when the individual resonators are arranged in either in linear or planar arrays. The preferred design for each resonator in a given array configuration will vary depending on desired layout of the individual resonators.

2. Description of the Related Art

Since the inventions of magnetic resonance imaging (MRI) in 1973, significant advances and developments of this method has turned it into a widely used clinical and research tool, which provides an unsurpassed, non intrusive technique to image soft tissues. The MRI is related to the phenomenon of nuclear magnetic resonance (NMR), which is based on the excitation and relaxation of nuclei (most frequently protons) within living tissues in a DC magnetic field. An excitation repulse at the Larmor frequency v, which is the precession frequency of protons in DC magnetic field ($v=63.8$ MHz for 1.5 Tesla), disturbs the equilibrium state of the nuclei. After the repulse, the nuclei relax to the equilibrium state with two different relaxation times ($T_1$ and $T_2$) and produce a weak decaying of signal.

In a MRI set-up, these weak decaying rf signals are detected by a receiver probe. For diagnostic usefulness of this signal, its level has to be well above the noise level, thus it puts premium on signal-to-noise ratio (SNR) of the receiver probe. In small volume MRI, MRI microscopy, low-field MRI, and NMR spectroscopy it has been shown that the Johnson noise of the rf receiver probe and/or preamplifier dominates, and thus determines the system noise floor.

In recent years, the design of phased arrays for parallel acquisition in MRI application has become the subject of a great deal of research. The drive for faster and faster acquisition rates calls for arrays with large number of receiving elements. As the number of array elements increases and their size continues to decrease, conductive losses become more dominant. These losses can overwhelm any signal-to-noise ratio (SNR) gains expected from the use of smaller coils that express less body noise.

Thus, it is desirable to reduce the thermal coil noise to improve the image resolution and reduce image acquisition time. Since the Johnson noise is a function of the product of resistance and temperature, reduction of either or both of these parameters enhances the SNR value of the MRI analysis. In addition, improved SNR can enable one to decrease voxel size and thereby increase the resolution of structural details.

Although many different MRI system exist, each has a limitation that involves the contribution of noise from the probe and the body being analyzed. As the need for greater resolution increases, the ability to use single coils is greatly reduced and the need for a different approach to signal acquisition is needed.

Thus, there is a need in the art for new probe structures that will operate in current and future MRI devices to increase signal acquisition with improved SNR and improved resolution without increasing the DC magnetic field strength or coil size.

SUMMARY OF THE INVENTION

The present invention provides a resonating apparatus for use in magnetic resonance imaging or related fields including a plurality of closely packed, composite resonators, where each resonator includes lands, tags, or tabs adapted to form decoupling capacitors between the resonators and capacitive contacts for connecting each resonator to a magnetic resonance imaging (MRI instrument. Each composite resonator includes two conductive coils formed on either side of a dielectric substrate. Each conductive coil includes at least one discontinuity or gap, where the gaps are maximally separated in the coil, meaning that intra-gap separation is maximized when a current carrier distance between all of the gaps is maximized. Additionally, the two coils are arranged so that an inter-gap separation is maximized and that the overlap of portion of the coils between the gaps is maximized. However, the resonators will work in the absence of maximal coil portion overlap. The composite resonators are capacitively decoupled from nearest neighbors by capacitors formed from outwardly extending lands, tags or tabs associated with the opposing coils on nearest neighbor resonators.

The resonators of this invention are formed from two opposing structures that form a resonant circuit. Throughout this application, the two structures are referred to as coils, which is a meaning inconsistent with the normal meaning of the word coil. Thus, a coil as used in this application means all structures, shapes or configurations of the two conductive layer with an interposed dielectric that form a resonant circuit.

By the term opposing, the inventors mean that the composite resonators include coils on each side of a dielectric substrate, i.e., the coils are formed on opposing sides or surfaces of the substrate. The term MRI has its traditional meaning a refers to any process for imaging internal structures in an animal including a human body using a static or DC external magnetic field and radio frequency transmitters to cause magnetically sensitive nuclei to absorb energy and radio frequency receivers to detect signals relating to the nuclear relaxation processes and process the detected signals into an image of the body structure. By the term NMR, the inventors mean nuclear magnetic resonance spectrometer and any variant thereof, then the resonators of this invention can be used to design new and improved probes for solids NMR or traditional liquids NMR.

The coils of this invention are designed so that the current carrier distances between the gaps on each coil (intra-coil gap separation) is substantially maximized or equivalently, the intra-coil gap carrier distance are substantially equal regardless of the shape of the current carrier which comprises the conductive material out of which the coils are formed on the dielectric substrate. While the resonators are designed to substantially maximize the inter-coil gap separation (the gaps on the two opposing coils are substantially maximized), i.e., all of the gaps on the two coils are substantially maximally separated—one of the coils is formed rotated relative to the other coil by an angle that results in this maximal separation.

Preferably, the portions of the coil between the gaps on each coil maximally overlap. Although the portions of the coils between the discontinuities of the two coils preferably are in an substantially overlapping configuration, the resonators will also work even when the portions are not substantially overlapping, but the frequency of the resonator will change according the frequency equations discussions below.

For regular shapes—regular polygons, the general rule controlling the fabrication of the resonators of this invention can be stated as follows: a maximal intra-coil gap or discontinuity separation occurs when, in degrees, the gaps in each coil are separated by an angle given by the formula 360°/n, where n is the number of discontinuities or gaps. The general rule for inter-coil gap or discontinuity separation in degrees is given by 360°/2n. Additionally, the continuous portion(s) between the discontinuities can be of any desired continuous shape; provided that in the preferred embodiments, the portions are designed so that the overlap between the portions is also maximized. These general fabrication rules are summarized in Table I which also identifies the array packing attainable with each coil type: 1 gap or discontinuity coils, 2 gap or discontinuity coils, 3 gap or discontinuity coils, etc.

TABLE I

Regular Polygon Gap Rules and Resulting Array Packing

| Number of Gaps | Intra-Coil Gap Angle | Inter-coil Gap Angle | Array Packing |
|---|---|---|---|
| 1 | 360° | 180° | chain |
| 2 | 180° | 90° | M × N rectangular packing |
| 3 | 120° | 60° | M × N hexagonal packing |
| 4 | 90° | 45° | M × N rectangular packing |

Although 1 to 4 gap coils are preferred from a packing efficiency stand point, there is actually no theoretical limit on the number of gaps or discontinuities per coil.

The present invention provides a resonating apparatus including two closely packed, capacitively decoupled, composite resonators having capacitive contacts adapted to connect each resonator with a monitoring device. The two resonators can be oriented in a mirror image configuration or in a series configuration as described more fully in association with the figures which illustrate preferred embodiments. Again, capacitive decoupling and capacitive connection are accomplished by outwardly extending lands, tags or tabs on each coil that make up each resonator, where the lands, tags or tabs are designed to overlay lands, tags or tabs on nearest neighbor resonator coils forming the decoupling capacitors; however, in certain resonators, then capacitive connections are formed of additional layered structures on top of coil portions generally proximate the gaps or discontinuities.

The present invention provides a resonating apparatus including a plurality of closely packed, capacitively decoupled, composite resonators having capacitive contacts adapted to connect each resonator with a monitoring device aligned in a 1×N array. Again, pairs of resonators can be oriented in a mirror image configuration or in a series configuration as described more fully in association with the figures which illustrate preferred embodiments.

The present invention provides a resonating apparatus including a plurality of closely packed, capacitively decoupled, composite resonators having capacitive contacts adapted to connect each resonator with a monitoring device arranged in an M×N array. In order to accommodate an M×N array of closely packed, capacitively decoupled composite resonators, the resonator coils must have at least two maximally separated discontinuities. Moreover, each composite resonator must be rotated 90 degrees with respect to its nearest neighbors, the resonators to the immediate, left, right, top and bottom of a centrally located resonator or some intermediate arrangement for resonates disposed at edges and corners of the array.

The present invention also provides an array of resonators including opposing coils having between about 2 and about 12 gaps per coil, preferably between about 2 and about 6 gaps per coil (for practical reasons) and particularly between about 2 and about 4 gaps per coil, where 2 to 4 gap coils represent the coils most easily patterned in a planar array or are better designed to cover a planar area and to fit into desired frequency range used for MRI applications.

The present invention also provides a method for fabrication the linear and planar arrays of resonators including the steps of depositing on a first surface of a dielectric substrate a conductive material. Once the conductive material is deposited, the conductive material is then patterned into a first pattern corresponding to a plurality of first resonator coils, each of the coils having at least one discontinuity therein and first lands, tags or tabs or first lands, tags or tabs and first islands. Next, the conductive material is deposited on a second or opposite surface of the dielectric substrate and patterned into a second pattern corresponding to a plurality of second resonator coils, each of the coils having at least one discontinuity therein and second lands, tags or tabs or second lands, tags or tabs and second islands, where each of the second coils is rotated relative to its corresponding first coil so that the discontinuities are maximally separated and where the first and second lands, tags or tabs or the first and second lands, tags or tabs and first and second islands overlap to form a sufficient number of connective capacitors to connect each resonator to a pre amp and a sufficient number of decoupling capacitors to decouple each resonator from its nearest neighbors. Next, a dielectric layer and a conductive metal layer are formed on the islands or tabs and contacts and wires are connected to the conductive metal layer providing external connection to the connective capacitors. And, finally, the structures is formed into a probe for use in MRI or NMR. Thus, the fabrication process produces a multi-layered array of resonators of this invention with connective and decoupling capacitors built into the resonators during fabrication. It should be recognized that external components such as transitional capacitors can also be connected between coils if the array is cut or otherwise fashioned into a non-planar configuration.

Alternatively, the present invention also provides a method for fabrication the linear and planar arrays having frequencies different than can be prepared using a prefabricated dielectric substrates. In this case, a first conductive layer is deposited on a dielectric substrate crystallographically capable with the conductive layer and patterned into an array of first resonant coils. A dielectric layer is then deposited over the array of first resonant coils to form the dielectric between the coils. Next, a second conductive layer is deposited on the dielectric layer and patterned to form an array of second resonant coils resulting in the formation of the resonator array. Connecting capacitors can be built by depositing on the substrate another dielectric layer and conductive material and wire bonding to the conductive material.

DESCRIPTION OF THE DRAWINGS

The invention can be better understood with reference to the following detailed description together with the appended illustrative drawings in which like elements are numbered the same:

FIGS. 2D-F depict another preferred embodiment of 1 discontinuity resonator of this invention;

FIG. 2G depicts a connecting capacitor formed on the resonator of FIGS. 2;

FIGS. 3A-D depict a 2 discontinuity resonator of this invention;

FIGS. 4A-D depict a 3 discontinuity resonator of this invention;

DETAILED DESCRIPTION OF THE INVENTION

Figure 1A:
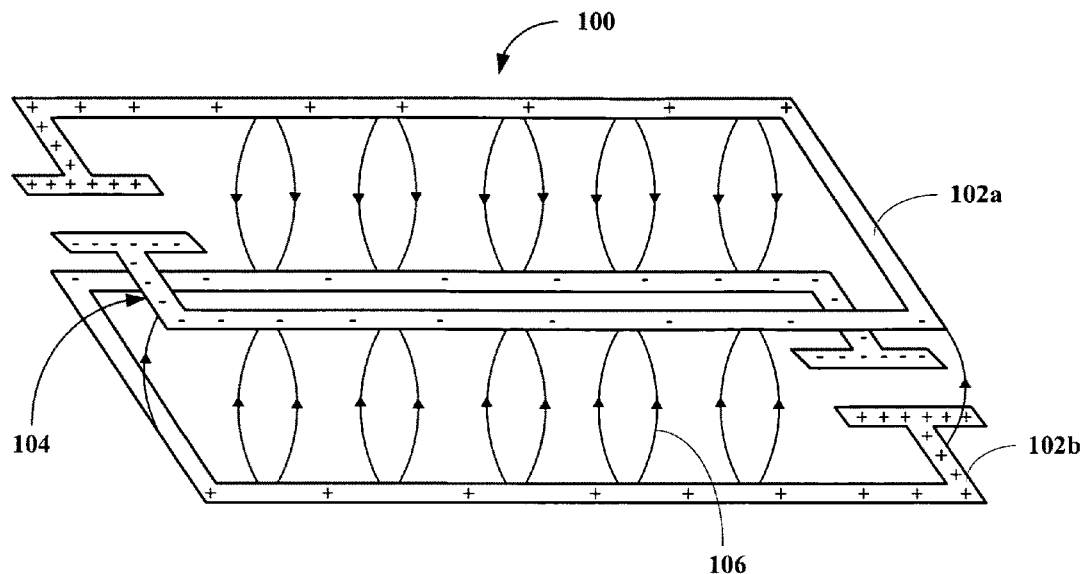
FIGS. 1A&B depicts electric field lines are shown for two cases: (A) double-sided coil with distributed capacitance and (B) for a single loop design
Figure 1B:
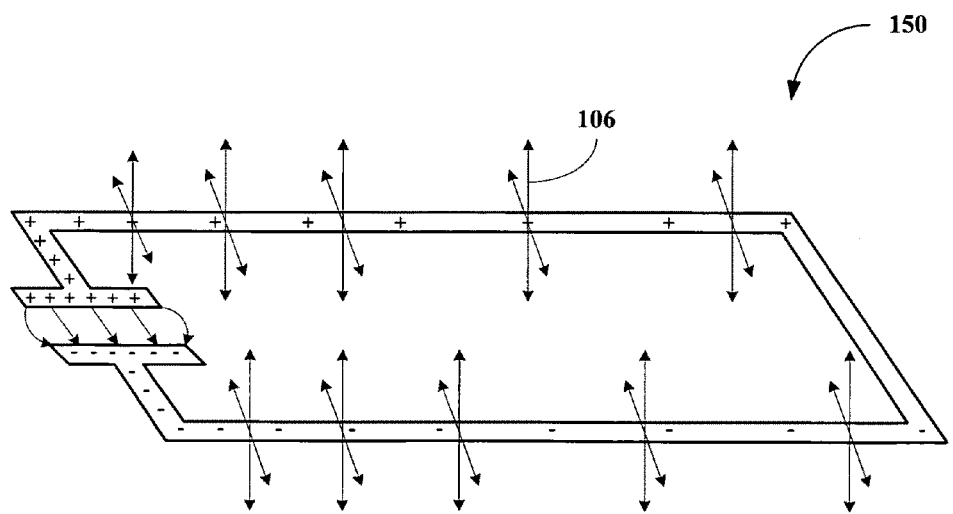

The inventors have found an MRI and NMR probes including multiple receiver, capacitively decoupled, resonators can be constructed to improve MRI imaging and NMR signals, while maintaining a significant part of the noise in each resonator relative to the noise contained in a region of the body or material being detected by each resonator. Each resonator includes two conductive layers separated by a dielectric and at least one gap in each conductive layer or coil where the gap are maximally separated both within a given coil and between the two opposing coils. Each resonator also includes decoupling capacitors patterned into the conductive layers as well as capacitive external contacts patterned into the conductive layer, where the dielectric substrate forms the capacitor dielectric.

The present invention relates broadly to a resonating apparatus for use in magnetic resonance imaging or related fields including a plurality of resonators having two conductive film coils formed on either side of a dielectric substrate, each conductive film coil including at least one discontinuity, where the discontinuities on each coil are maximally separated and the coils are oriented such that all of the discontinuities on the two opposing coils are maximally separated, e.g., for one discontinuity coils, the opposing coils are oriented so that the discontinuities are separated by 180 degrees, for two discontinuity coils forming a regular polygon, the discontinuities on each coil are separated by 180 degrees and the coils are oriented so that all of the discontinuities are separated by 90 degrees, for three discontinuity coils forming a regular polygon, the discontinuities on each coil are separated by 120 degrees and the coils are oriented so that all the discontinuities are separated by 60 degrees, while for four discontinuities regular polygonal coils, the discontinuities on each coil are separated by 90 degrees and the coils are oriented so that all of the discontinuities are separated by 45 degrees. Generally, the two opposing regular polygonal coils are configured so that the angle between the two coils is half of the angle separating the discontinuities on each coil.

The present invention provides a resonator adaptable for use in magnetoresonant imaging, including a first resonant coil, comprising an electrically conductive material, a second resonant coil, comprising an electrically conductive material, the second resonant coil coupled inductively and capacitively to the first resonant coil and a dielectric substrate interposed between the first resonant coil and the second resonant coil, where the resonator forms a substantially planar structure and where the coils and dielectric substrate are preferably thin films. The electrically conductive material can be any highly conductive material, but is preferably a material suitable such as high conductivity normal metals, superconductor, high conductivity conductive polymers, high temperature superconductors, such as MgB2 and YBCO or similar materials.

The present invention provides a resonator adaptable for use in magnetoresonant imaging, including a dielectric substrate, a first resonant coil disposed on a first surface of the dielectric substrate. The first resonant coil includes an electrically conductive material arranged as a conducting loop having a first discontinuity therein, a first land or tab disposed proximate a first end of the first discontinuity and a second land disposed proximate a second end of the first discontinuity, where the first and second lands form a cooperative pair of lands. The resonator also includes a second resonant coil disposed on a second surface of the dielectric substrate opposite the first surface of the dielectric substrate. The second resonant coil includes an electrically conductive material arranged as a conductive loop having a second discontinuity, where the second discontinuity is disposed substantially at a point furthest from the first discontinuity of the first resonant coil, a first land disposed proximate a first end of the second discontinuity, and a second land disposed proximate a second end of the second discontinuity, where the first and second lands form a second cooperative pair of lands. The resonator also includes contact zones in electrical communication with the two cooperative pairs of lands adapted to communicate an electromagnetic signal between the resonator and scanner electronics. The contact zones can also include an insulator disposed between one of the lands of each of the pair of lands and can be fabricated out of a metal or a superconducting material or the land itself. The lands are adapted to provide capacitive coupling between at least one signal channel and the resonator. The coils define any predetermined shape such as a substantially parallelogram shape, a substantially circular shape, a substantially rectangular shape, a substantially oval shape, a substantially non-parallelogram shape or any other desired shape.

The present invention also provides a resonator adaptable for use in magnetoresonant imaging including a dielectric substrate, a first resonant coil disposed on a first surface of the dielectric substrate and a second resonant coil disposed on a second surface of the dielectric substrate opposite the first surface of the dielectric substrate. The first resonant coil including an electrically conductive material having first discontinuity and a second discontinuity and otherwise forming a continuous geometry defining a predetermined shape, where the second discontinuity is disposed at a position on the first resonant coil substantially maximally separated from the first discontinuity. The first resonator coil also includes a first land disposed proximate a first end of the first discontinuity, a second land disposed proximate a second end of the first discontinuity, where the first and second lands form a first pair of lands. The first resonator coil also includes a third land disposed proximate a first end of the second discontinuity and a fourth land disposed proximate a second end of the second discontinuity, where the third and fourth lands form a second pair of lands. The second resonant coil includes an electrically conductive material arranged in a shape substantially congruent to the shape of the first resonant coil having a first discontinuity and second discontinuity substantially maximally separated therefrom. The second resonator coil also includes a first land disposed proximate a first end of the first discontinuity and a second land disposed proximate a second end of the first discontinuity, where the first and second lands form a third pair of lands. The second resonator coil also includes a third land disposed proximate a first end of the second discontinuity and a fourth land disposed proximate a second end of the second discontinuity, where the third and fourth lands form a fourth pair of lands. At least one land includes a contact zone, adapted to communicate an electromagnetic signal between a scanner and the resonator. The contact zone can also be capacitively coupled to the land through an insulator interposed between the land and the contact zone, where the contact zone is an electrically conductive material. Again the lands are adapted to provide capacitive coupling between at least one of scanner channel and the resonator. The resonator coils have a predetermined shape which can be, but not limited to, a substantially parallelogram shape, a substantially circular shape, a substantially round shape, a substantially oval shape, a substantially non-parallelogram shape or any other continuous shape having one or more discontinuities therein that is capable of acting as a resonance circuit.

The present invention also provides a probe useful for magnetoresonant imaging including a housing and a resonator, disposed in the housing, and an amplifier. The resonator is adaptable for use in magnetoresonant imaging and includes at least one 1 discontinuity resonator or at least one 2 discontinuity resonator. The 1 discontinuity resonator includes a conductive material arranged in a continuous geometry on a dielectric substrate save for a single discontinuity therein, a first land disposed proximate a first end of the discontinuity and a second land disposed proximate a second end of the discontinuity. The 2 discontinuity resonator includes a conductive material arranged in a continuous geometry on a dielectric substrate save for two discontinuities, where the two discontinuities are substantially maximally separated in the otherwise continuous geometry. The 2 discontinuity resonator also includes a first land disposed proximate a first end of the first discontinuity, a second land disposed proximate a second end of the first discontinuity, a third land disposed proximate a first end of the second discontinuity, and a fourth land disposed proximate a second end of the second discontinuity. The amplifier is adapted to receive an electromagnetic signal from the resonator and communicate that signal to an external receiver and where the amplifier capacitively coupled to either the first resonator coil or the second resonator coil.

The probe can also include a means for thermally connecting the array to a cryogenic fluid or a cold finger to provide cryogenic cooling to the array to reduce the temperature of normal metals or below the $T_c$ of the superconducting material to improve SNR. Preferably, the conductive material out of which the resonators are fabricated is a superconducting material.

The resonator can also have a curved profile such a convex profile, a concave profile or combination regions that are convex and regions that are concave to conform the shape of the probe to shape of the object of interest. For a single resonator, the curve profile is achieved by deforming the resonator out of polarity.

The probe can also include an array of resonators disposed within the housing, where each resonator capacitively coupled to an amplifier and where each resonator is capacitively decoupled from its nearest neighbors through built-in decoupling capacitors comprising overlapping lands on the neighboring resonators. The probe can also include a metal block disposed within the housing to which a predetermined number resonators are attached. The metal block comprises copper.

The array of resonators can be arranged in the probe as an 1×N array or linear array, an M×N array or matrix or planar array or a mixture of 1×N arrays and M×N arrays, where each array is formed on a dielectric substrate. The arrays can be composed of 1 discontinuity resonators, 2 discontinuity resonators, 3 discontinuity resonators, 4 discontinuity resonators or a mixture of 1-4 discontinuity resonators.

The array can also have a curved profile such a convex profile, a concave profile or combination regions that are convex and regions that are concave to conform the shape of the probe to shape of the object of interest. It should be recognized that probes incorporating curved resonators or resonator arrays can also assume a curved profile.

The present invention also provides a method of using a probe of this invention useful for magnetoresonant imaging including the steps of connecting a probe to a source of cooling where the probe includes a housing, a resonator of this invention adaptable for use in magnetoresonant imaging and an amplifier adapted to receive an electromagnetic signal from the resonator and communicate that signal to an external receiver where the amplifier capacitively coupled to the resonator. The method can also include those steps commonly used in MRI signal collection and processing to produce an image of the object of interest.

The probe of this invention are particularly useful because each resonator in the arrays can be separating measured and amplified allowing for substantially parallel processing to obtain real time or near real time magnetic resonance images. The method can also include the steps of providing a plurality of resonators in the housing, using the plurality of resonators to obtain simultaneous signals, each of the simultaneous signals being obtained from at least one of (i) a single resonator coil or (ii) a single pair of resonator coils and processing the simultaneous signals to create a unified view of a target under the probe.

The arrays are particularly unique because all of the electrical elements needed to make the resonators, the connective capacitors and the decoupling capacitors are all made during fabrication using techniques used in microprocessor fabrication, where the substrate here is a dielectric material instead of a semi-conductor material.

High-temperature superconductors (HTS) are extremely attractive materials out of which MRI probes can be constructed due to their very low losses compared to traditional metals. A superconductor is completely loss less (below its critical temperature) at zero frequency, provided that an applied DC current is less than its critical current. At higher frequencies, finite losses result when rf screening currents flowing near a surface of such materials within a penetration depth of about 0.3 μm due to the presence of uncondensed normal carriers in such materials.

Microwave measurements of Y $Ba_2Cu_3O_x$ (YBCO) films at 77 K yield a surface resistance $R_s$ of 150 μΩ at 10 GHz, which is nearly two orders of magnitude lower than the surface resistance of OFHC copper at the same frequency and temperature. Scaling both the values of $R_s$ down to 100 MHz indicates that superconducting YBCO will have a surface resistance at least four orders of magnitude lower than that of OFHC copper at this frequency. Although YBCO represents a specific class of so called high-temperature superconductors, the present invention is not limited to a particular conductive material. In fact, the resonators of this invention can be fabricated out of any conductive material or mixtures thereof, including, without limitation, low temperatures superconducting materials, high temperatures superconducting materials, such as YBCO, MgB2, or the like, metals or any other conducting material or mixtures or combinations thereof. One aspect of the probes of this invention is that the probes of this invention are designed to be sufficiently small that noise in the resonator is greater than the noise in the volume of the material or body being monitored or studied and are designed to be cooled to enhance resonator properties and improve the signal-to-noise ratio (SNR).

In addition to the fact that application of HTS coils in phased arrays looks very promising, the latest development in shortening acquisition time opens a new application field for superconducting coils, and especially HTS coils. New theoretical and practical concepts were recently reported that significantly enhanced MRI performance by using arrays of multiple receiver coils arranged around the body: SMASH D (Simultaneous Acquisition of Spatial Harmonics) (see Sodickson, W. J. Manning, *Magnetic Resonance in Medicine*, 38,591 (1997)) and SENSE (SENsitivity Encoding) (see K. P. Pruessman, M. Weiger, M. B. Scheidegger, and P. Boesiger, *Magnetic Resonance in Medicine*, 45,952 (1999)). These techniques along with other similar techniques or modifications thereof allow for parallel image acquisition using existing fast-imaging pulse sequences. By using SENSE, it was reported that conventional scan time was reduced almost twice for two-coil arrays and three times for five-coil arrays. These new techniques also showed significant reductions in SNR. Thus, by using superconducting surface coils both very fast (real time) imaging and high SNR (high resolution) can be achieved. The resonator arrays of this invention are ideally suited for these new techniques as well as new variants and other modification to these types of MRI techniques, because the arrays of this invention can improve image quality and especially speed by allowing for parallel and large scale parallel processing from each resonator of a 1×N or M×N array of resonators of this invention.

The use of cryogenically cooled cooper/HTS coils can extend the depth at which SNR gains can be achieved through phased array acquisition. The potential SNR gain using large arrays increases with the number of elements: SNR gain went up significantly when single cell (N=1) was replaced with four coils (N=4), and it would increase more for N=8 or N=16. Thus, the potential advantage of cryogenically cooled receiver arrays with a large number of elements becomes even greater. These SNR gains can be used alongside parallel imaging to achieve higher accelerations while preserving maximum available image SNR.

The twin horseshoe resonator coils—1 gap coils arranged to have Ci symmetry (symmetric through a point of inversion), used as a basic element for the arrays of composite resonators of this inventions are designed as a pair of symmetrically balanced coils with a virtual ground plane. In such an arrangement, the maximum voltage produced in one coil with respect to ground is one half of what would be obtained for only one end of the grounded coil. Since there are two coils placed face to face, in an opposing relationship, their voltages are confined in the dielectric substrate.

Illustrative Examples of Single Resonator Constructs

Referring now to FIGS. 1A&B, the difference in an electric field distribution between the two-sided resonator designs of this invention, generally 1, and a single loop design, generally 150, are shown. When a pair of properly aligned loops or coils 102a and 102b having a dielectric substrate 104 interposed between them, then the resulting electric field 106 is confined within the dielectric substrate 104 and does not extend above or below resonator 100. Thus, such resonators 100 when used to image a body of an animal including a human, the generated electric field, being confined in the dielectric 104, does not penetrate the body. A similar design principle has been used for single superconducting coils. On the other hand, in the single loop design 150, the resulting electric field extends above and below the loop 150 and will penetrate into a body when used as an imaging resonator.

A resonator created by such double-sided patterned coil or loop structures has the highest magnetic sensitivity, while working in an "in phase mode." The term "in phase mode" means that current flows in both coils in the same direction, thus produces the largest magnetic field around the resonator.

Figure 2A:
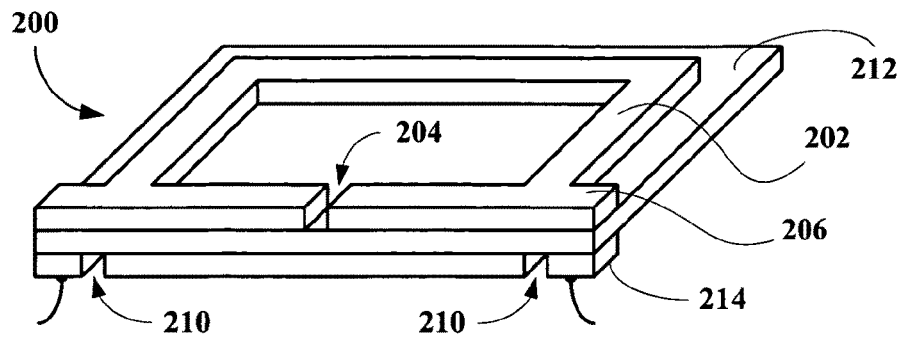
FIGS. 2A-C depict a preferred embodiment of a 1 discontinuity resonator of this invention.
Figure 2B:
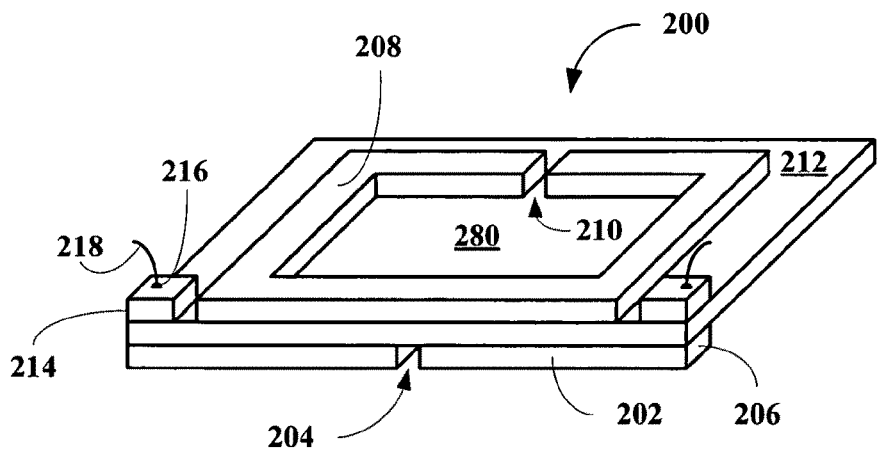
Figure 2C:
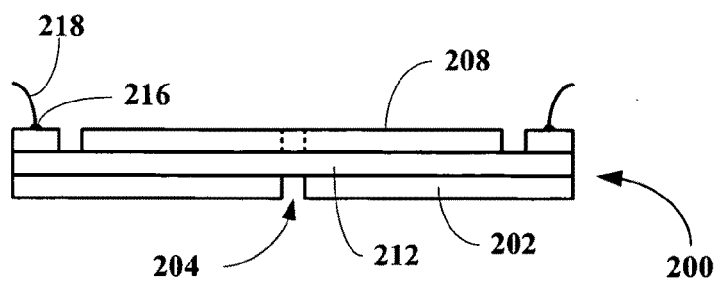

Referring now to FIGS. 2A-C, a preferred embodiment of a single resonator of this invention, generally 200, from which arrays can be constructed is shown to include a top coil 202 made of a conducting material, preferably a superconducting material and particularly an HTS material. The top coil 202 includes a discontinuity 204 and two outwardly extending protrusions or lands, tags or tabs 206 on opposite sides of the discontinuity 204. The resonator 200 also includes a bottom, opposing coil 208, also made of a conducting material, preferably a superconducting material and particularly an HTS material. The bottom coil 208 also includes a discontinuity 210 arranged to be maximally separated from the discontinuity 204 of the top coil 202, i.e., the bottom or second coil 208 is rotated 180 degrees relative to the first or top coil 202, thus achieving maximal discontinuity separation. The resonator 200 also includes a dielectric substrate 212 interposed between the two coils 202 and 208 into which the generated electric field is confined. Unlike the top coil 202, the bottom coil 208 does not include tabs 206, but instead includes a pair of islands 214 of conductive material positioned in a capacitive relationship to the tabs 206, i.e., the tabs 206 and the islands 214 with the dielectric 212 therebetween forming capacitors 215. The resonator 200 also includes a pair of contacts 216 with wires 218 bonded thereto so that the resonator 200 can be connected to a monitoring device such as an MRI imaging device or an NMR instrument. As shown in FIG. 13A, the dielectric 212 extends into interior 220 of the resonator 200. Although this extension is not necessary as shown in FIGS. 2D-F, having the dielectric extend into the interior regions 220 and out past the coils 202 and 208 is a manufacturing convenience and does not adversely affect resonator performance.

Referring now to FIGS. 2D-F, another preferred embodiment of a single resonator of this invention, generally 250, from which arrays can be constructed is shown to include a top coil 252 made of a conducting material, preferably a superconducting material and particularly an HTS material. The top coil 252 includes a discontinuity 254 and has a general horseshoe shape. The resonator 250 also includes a bottom, opposing coil 258, also made of a conducting material, preferably a superconducting material and particularly an HTS material. The bottom coil 258 also includes a discontinuity 260. Thus, in this preferred embodiment, the coils 252 and 258 are identical and are arranged so that the discontinuities 254 and 260 are maximally separated, i.e., the bottom or second coil 258 is rotated 180 degrees relative to the first or top coil 252, thus achieving maximal discontinuity separation. The resonator 250 also includes a dielectric substrate 262 interposed between the two coils 252 and 258 into which the generated electric field is confined. Unlike the resonator design of FIGS. 2A-C, the resonator design of FIGS. 2D-F does not include capacitors formed from tabs 206 in the top coil 202 and islands 214 associated with the bottom coil 208. Instead, a pair of capacitors 264 are formed on the top coil 252 (or the bottom coil 258 not shown) at positions 266 on either side of the discontinuity 204 (210). Each capacitor 264 includes a dielectric layer 268 formed on a top surface 270 of the top coil 252 and a conductive layer 272 formed on top of the dielectric layer 268. The resonator 250 also includes a pair of contacts 274 formed on a top surface 276 of the conductive layer 272 having wires 278 bonded thereto so that the resonator 250 can be connected to a monitoring device such as an MRI imaging device or an NMR instrument. Unlike the resonator 200 of FIGS. 2A-C, the dielectric 262 of the resonator 250 does not extends into interior 280 of the resonator 250. Again, whether the dielectric 212 or 262 extends into the interior 220 or 280 is a matter of design and manufacturing convenience and has no adverse affect on resonator performance.

Referring now to FIG. 2G, an expanded view of the capacitors 264 are shown, including a portion of the top coil 252, a portion of the bottom coil 258 and a portion of the dielectric 262. On the top surface 270 of the top coil 252 is formed the dielectric layer 268 and formed on top of the dielectric layer 268 is the conductive layer 272. Formed on the top surface 276 of the conductive layer 272 is the contact 274 with the wire 278 extending outward therefrom.

Referring now to FIGS. 3A-D, another preferred embodiment of a single resonator of this invention, generally 300, from which arrays can be constructed is shown to include a top coil 302 made of a conducting material, preferably a superconducting material and particularly an HTS material. The top coil 302 includes first and second discontinuities 304a&b and four protrusion or tabs 306 extending out from the discontinuities 304a&b. The resonator 300 also includes a bottom, opposing coil 308, also made of a conducting material, preferably a superconducting material and particularly an HTS material. The bottom coil 308 also includes two discontinuities 310a&b. In this design, the two coils are identical and the discontinuities of each coil are maximally separated. The two coils 302 and 308 are arranged so that all discontinuities 304a&b and 310a&b are maximally separated, i.e., the bottom or second coil 308 is rotated 90 degrees relative to the first or top coil 302, thus achieving maximum discontinuity separation. The resonator 300 also includes a dielectric substrate 312 interposed between the two coils 302 and 308 into which the generated electric field is confined.

Like the resonator design of FIGS. 2D-E, the resonator design of FIGS. 3A-D includes a pair of capacitors 314 formed on the top coil 302 (or on the bottom coil 308 not shown) on the tabs 306. Each capacitor 314 includes a dielectric layer 316 formed on a top surface 318 of its tab 306 and a conductive layer 320 formed on top of the dielectric layer 318. The resonator 300 also includes a pair of contacts 322 formed on a top surface 324 of the conductive layer 320 having wires 326 bonded thereto so that the resonator 300 can be connected to a monitoring device such as an MRI imaging device or an NMR instrument.

As shown in FIGS. 3A-D, the dielectric 312 extends into interior 328 of the resonator 300. Although this extension is not necessary as shown in FIGS. 2D-F, having the dielectric 312 extend into the interior 328 and optionally out past the coils 302 and 308 is a matter of manufacturing convenience and does not adversely affect resonator performance.

Referring now to FIGS. 4A-D, another preferred embodiment of a single resonator of this invention, generally 400, having a substantially hexagonal shape from which arrays can be constructed is shown to include a top coil 402 made of a conducting material, preferably a superconducting material and particularly an HTS material. The top coil 402 includes three discontinuities 404a-c. The resonator 400 also includes a bottom, opposing coil 406, also made of a conducting material, preferably a superconducting material and particularly an HTS material. The bottom coil 408 also includes three discontinuities 408a-c. In this design, the two coils are identical and the discontinuities of each coil are maximally separated, i.e., each discontinuity is 120 degrees away from its nearest neighbor; provided, of course, that the current carrier distance between the discontinuities are substantially identical. The two coils 402 and 408 are arranged so that all discontinuities 404a-c and 410a-c are maximally separated, i.e., the bottom or second coil 408 is rotated 60 degrees relative to the first or top coil 402, thus achieving maximum discontinuity separation. The resonator 400 also includes a dielectric substrate 410 interposed between the two coils 402 and 408 into which the generated electric field is confined. One advantage of the hexagonal resonators 400 arrays made from regular hexagons represent a maximum in resonator density for a given surface area.

Like the resonator designs of FIGS. 2D-E and FIGS. 3A-D, the resonator design of FIGS. 4A-D includes a pair of capacitors 412 formed on the top coil 402 (or on the bottom coil 408 not shown). Each capacitor 412 includes a dielectric layer 414 formed on a top surface 416 of its tab 406 and a conductive layer 418 formed on top of the dielectric layer 418. The resonator 400 also includes a pair of contacts 420 formed on a top surface 422 of the conductive layer 420 having wires 424 bonded thereto so that the resonator 400 can be connected to a monitoring device such as an MRI imaging device or an NMR instrument.

As shown in FIGS. 4A-D, the dielectric 412 extends into interior 426 of the resonator 400. Although this extension is not necessary as shown in FIGS. 2D-F, having the dielectric 412 extend into the interior 428 and optionally out past the coils 402 and 408 is a matter of manufacturing convenience and does not adversely affect resonator performance.

Figure 5A:
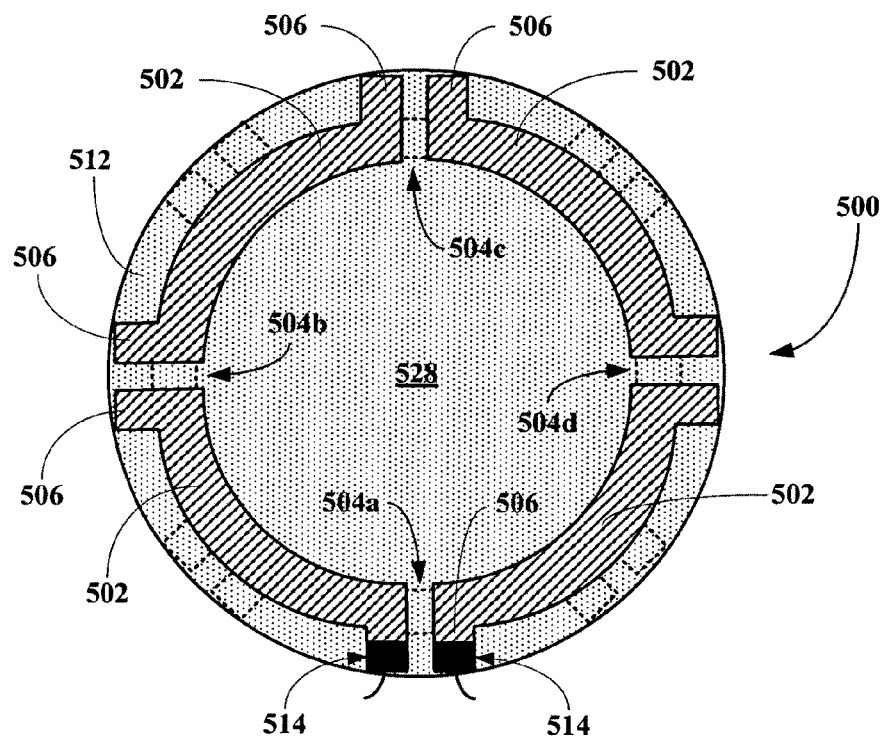
FIGS. 5A-B depict a 4 discontinuity resonator of this invention.
Figure 5B:
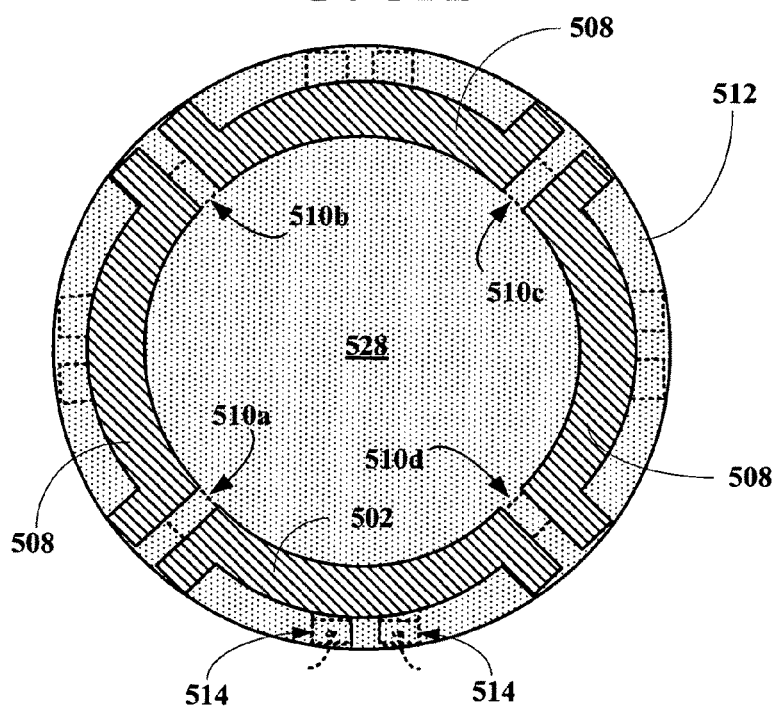

Referring now to FIGS. 5A-B, another preferred embodiment of a single resonator of this invention, generally 500, having a circular shape from which arrays can be constructed is shown to include a top coil 502 made of a conducting material, preferably a superconducting material and particularly an HTS material. The top coil 502 includes four discontinuities 504a-d and eight protrusion or tabs 506 extending out from the discontinuities 504a-d. The resonator 500 also includes a bottom, opposing coil 508, also made of a conducting material, preferably a superconducting material and particularly an HTS material. The bottom coil 508 also includes four discontinuities 510a-d. In this design, the two coils are identical and the discontinuities of each coil are maximally separated, i.e., each discontinuity is 90 degrees away from its nearest neighbor. The two coils 502 and 508 are arranged so that all discontinuities 504a-d and 510a-d are maximally separated, i.e., the bottom or second coil 508 is rotated 45 degrees relative to the first or top coil 502, thus achieving maximum discontinuity separation. The resonator 500 also includes a dielectric substrate 512 interposed between the two coils 502 and 508 into which the generated electric field is confined.

Like the resonator designs of FIGS. 2D-E, FIGS. 3A-D and FIGS. 4A-D, the resonator design of FIGS. 5A-D includes a pair of capacitors 514 are formed on the top coil 502 (or on the bottom coil 508 not shown) on the tabs 506.

As shown in FIGS. 5A-D, the dielectric 512 extends into interior 516 of the resonator 500. Although this extension is not necessary as shown in FIGS. 2D-F, having the dielectric 512 extend into the interior 528 and optionally out past the coils 502 and 508 is a matter of manufacturing convenience and does not adversely affect resonator performance.

Moreover, as shown in FIGS. 5A-B, the coils do not have to be rectilinear but can be curvilinear. The coils in FIGS. 2-4 are all rectilinear—square or rectangular shapes, while the coils of FIG. 5 are circular shaped. It should be recognized that the shape of the coils between each discontinuity must only be continuous so that the conductive material therebetween acts as a transmission pathway having both capacitance and inductance.

Equivalent Resonator Circuit

Figure 6A:
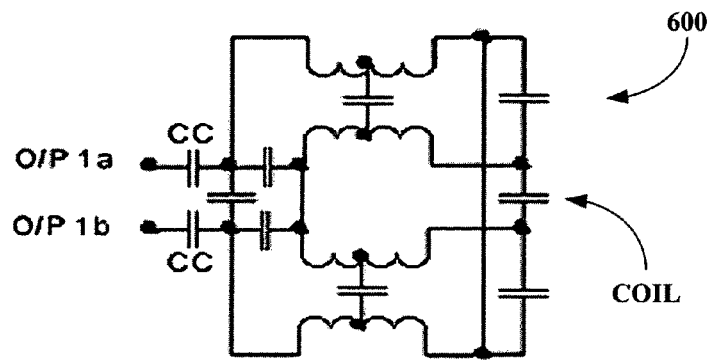
FIGS. 6A-C depict equivalent circuits for one to three 1 discontinuity resonators of this invention, where two and three resonators are configures linearly.
Figure 6B:
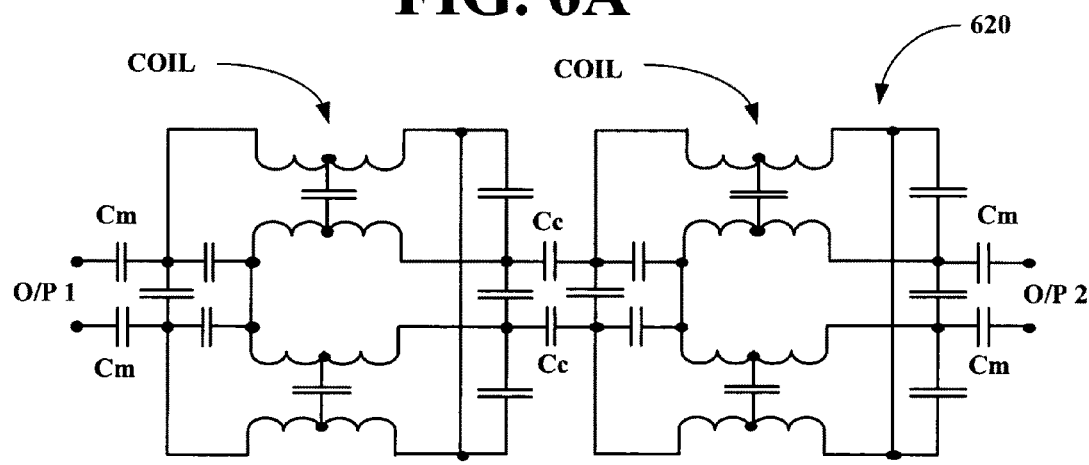
Figure 6C:
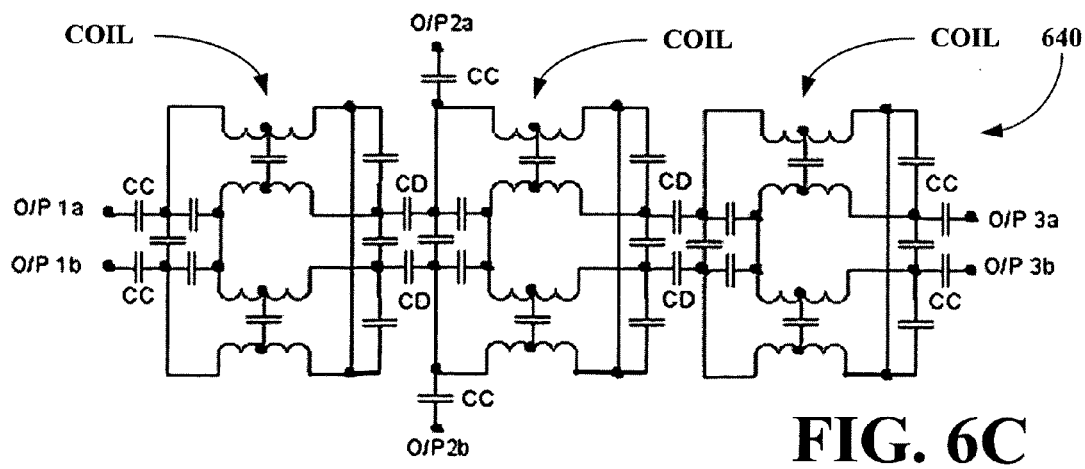

Referring now to FIGS. 6A-C, equivalent circuit diagrams for 1 discontinuity per coil resonator, for two 1 discontinuity per coil resonators and three 2 discontinuity per coil resonators. Looking at FIG. 6A, a 1 discontinuity per coil resonator can be represented by an equivalent circuit, generally 600. The equivalent circuit 600 includes input outputs O/P1a&1b, coupling capacitors CC with the coils represented by the inductor/capacitor loop COIL.

Looking at FIG. 6B, two 1 discontinuity per coil resonators in a linear array can be represented by an equivalent circuit, generally 620. The equivalent circuit 620 includes input outputs O/P1 and O/P2 for each resonator, respectively, coupling capacitors Cm and decoupling capacitors Cc with the coils for each resonator are represented by the inductor/capacitor loop COIL.

Looking at FIG. 6C, three 1 discontinuity per coil resonators in a linear array can be represented by an equivalent circuit, generally 640. The equivalent circuit 640 includes input outputs O/P1a&b, O/P2a&b and O/P3a&b for each resonator, respectively, coupling capacitors CC and decoupling capacitors CD with the coils for each resonator are represented by the inductor/capacitor loop COIL.

Array of Resonators and Probed Including Such Arrays

The above figures illustrated three basic designs for the resonator elements of the resonator apparatuses of this invention that are composed either of 1×N or M×N arrays of such resonators. Although examples for each basic design are shown, it should be recognized that the exact structure of each resonator coil in an array of coils will be depend not only on the need for connector capacitors, but also decoupling capacitors and on the design of the array itself Thus, the ordinary artisan has a lot of design latitude; provided, of course, that the discontinuities per coils are maximally separated and all of the discontinuities in the resonator are maximally separated.

The resonating apparatuses of this invention comprise array of closely packed resonators (two sided coils) that can be aligned one dimensionally as a chain (1×N arrays), or two dimensional array or matrix arrays covering an area (M×N arrays) in rectangular packing or hexagonal packing. Alternatively, the resonating apparatus of this invention can include a plurality of separate linear and/or matrix arrays; provided that each of the arrays in the plurality are separated sufficiently to be non-inductively coupled or only weakly coupled.

In linear and matrix arrays, adjacent, nearest neighbors, resonators have mutual inductance. Such mutual inductance should preferably either be reduced or eliminated, i.e., the coils preferably should not "see" each other or should preferably be decoupled. To decouple mutual inductances between nearest neighboring resonators, the patterned constructs of this invention includes tags, tabs or protrusions extending from each coil towards its neighbor(s), preferably, nearest neighbors, but the resonator arrays can also be designed with nearest neighbor and diagonal neighbor decoupling. Decoupling capacitors, electrically coupling the nearest neighbor or nearest and diagonal neighbor resonators, are formed by aligning the tabs or protrusions associated with the coils of neighboring resonators, a top coil on one resonator to a bottom coil on a second resonator and so on. It should be recognized that the decoupling capacitors can be formed using structures from both sides of the dielectric substrate or the decoupling capacitors can be form on a single side of the dielectric substrate as described above. By designing in an appropriate value of capacitance in the overlapping tabs, the mutual inductance between neighboring resonators can be effectively compensated, reduced or eliminated, thus these built-in capacitors act as decoupling capacitors. As shown above, cables or wires are capacitively coupled to each array through the contacting capacitors 215, 264, 314, 414 and 514 of the FIG. 2-5. Each resonator has two build-in two coupling capacitors with associated contacts and wires for connecting the resonator to a monitoring device. All of the resonators and resonator arrays of this invention are constructed using modem solid state electronic fabrication technology as well as the structures for capacitive coupling of the superconducting or normal metal resonators to a monitoring device and capacitive decoupling to the nearest neighbor resonates.

Figure 7A:
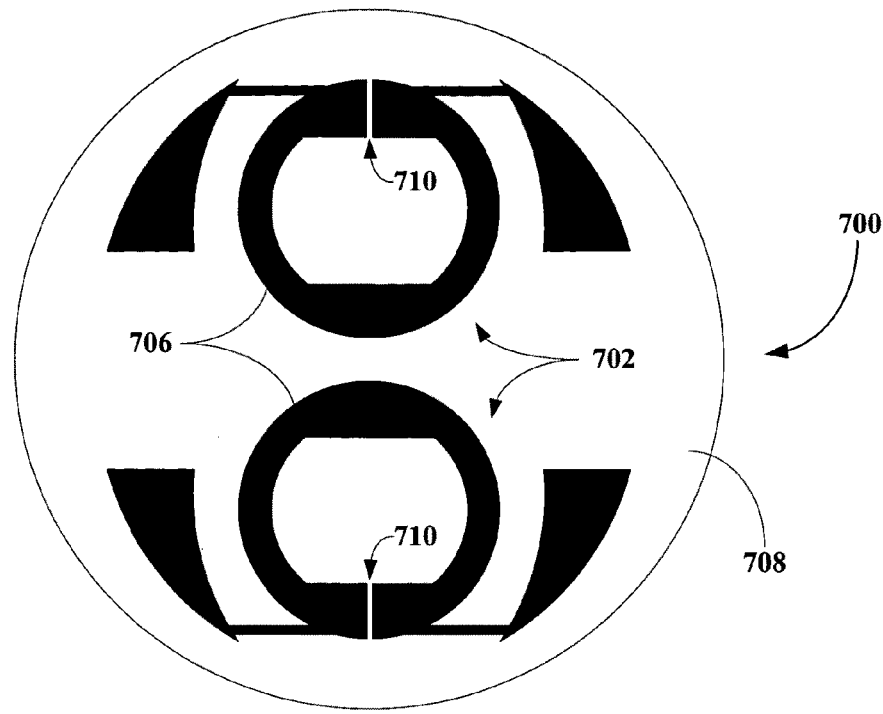
FIGS. 7A-B depict a preferred embodiment of a 1×2 array of 1 discontinuity resonators of this invention.
Figure 7B:
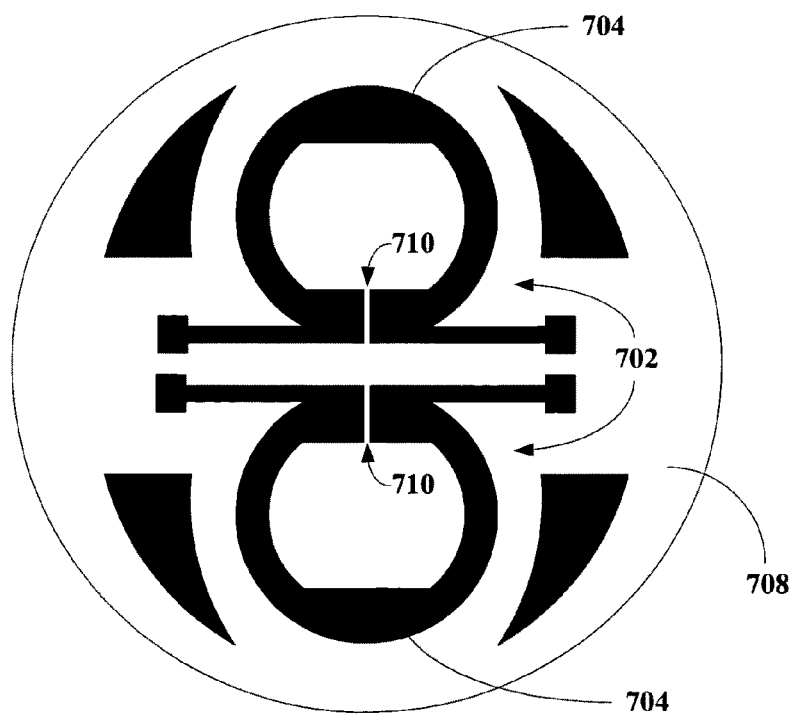
Figure 7C:
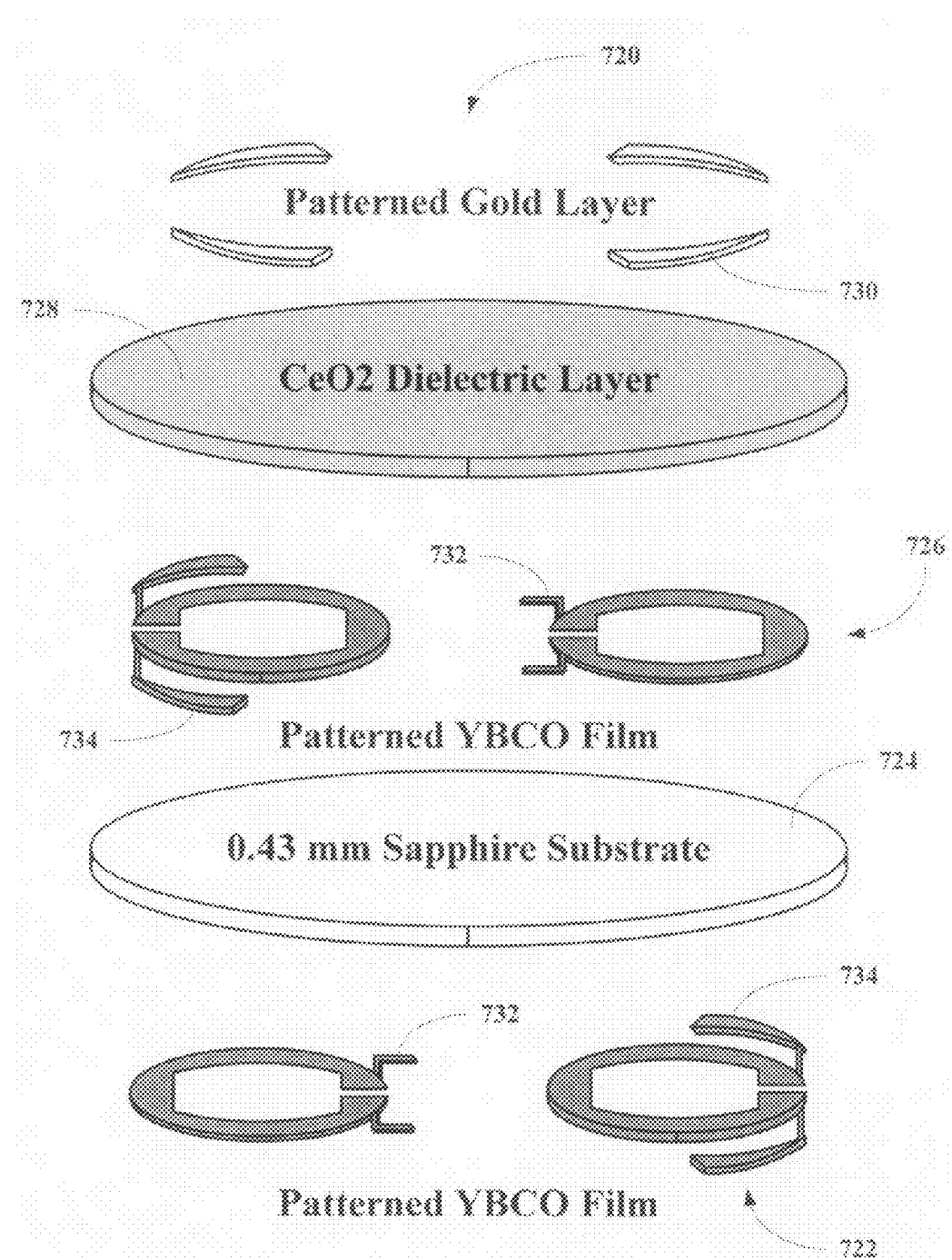
FIG. 7C depicts another preferred embodiment of a 1×2 array of 1 discontinuity resonators of this invention.
Figure 7D:
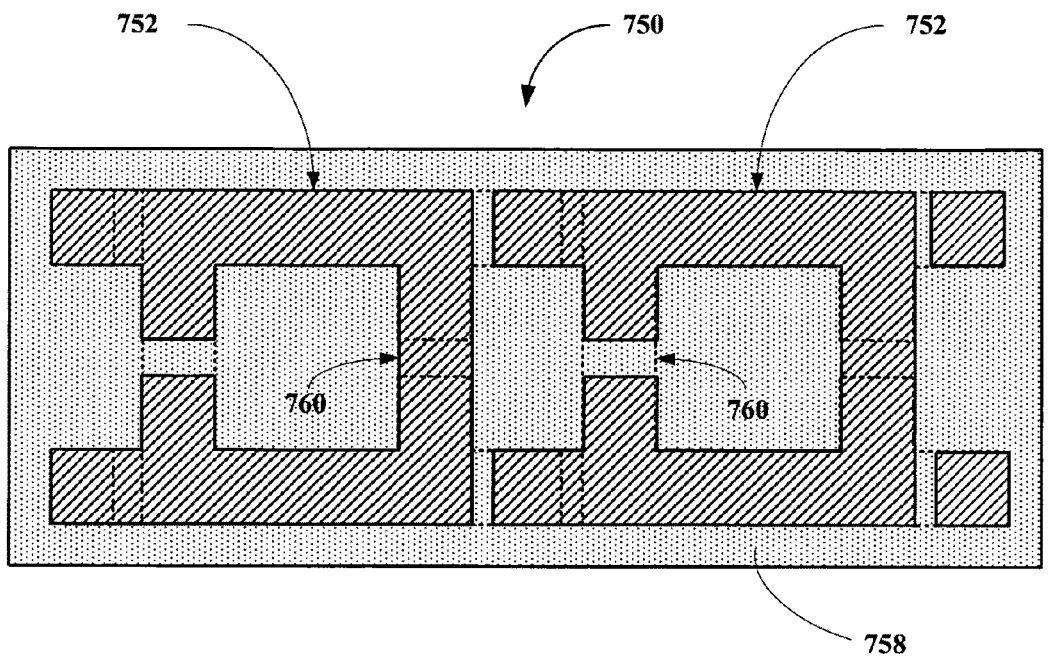
FIG. 7D-E depict another preferred embodiment of a 1×2 array of 1 discontinuity resonators of this invention.

Referring now to FIGS. 7A&B, a preferred embodiment of a linear array comprising two resonators of this invention, generally 700, is shown to include a pair of resonators 702. Each resonator 702 includes a top coil 704 and an opposing bottom coil 706 with a dielectric substrate 708 extending out past the resonators 702. Each of the coils 704 and 706 has a single discontinuity 710 designed therein. The coils 704 and 706 are circular shaped and are arranged in a mirror imaged relationship. Each top coil 704 includes a pair of decoupling capacitors 712 formed thereon on each side of the discontinuities 710. The resonators 702 also include connecting capacitors (not shown). The array design 700 shows that the decoupling capacitors 712 can be formed on the same side of the resonator. Looking at FIG. 7C, an alternative array 720 includes bottom coils 722, a dielectric 724, top coils 726, a second dielectric 728 and gold contacts 730. In this case, tabs 732 form the decoupling capacitors and wings 734 in combination with the gold contacts 730 from the connecting capacitors. Looking at FIGS. 7D&E, a preferred embodiment of a linear array comprising two resonators of this invention, generally 750, is shown to include a pair of resonators 752. Each resonator 752 includes a top coil 754 and an opposing bottom coil 756 with a dielectric substrate 758 extending out past the resonators 752. Each of the coils 754 and 756 has a single discontinuity 760 designed therein. The coils 754 and 756 are square shaped. The resonators 753 are decoupled by a pair of decoupling capacitors 762 formed thereon on each side of the discontinuities 760 by tabs 764. The resonators 752 also include islands 766 which in conjunction with the tabs 764 can form sites for connecting capacitors (not shown).

Figure 8A:
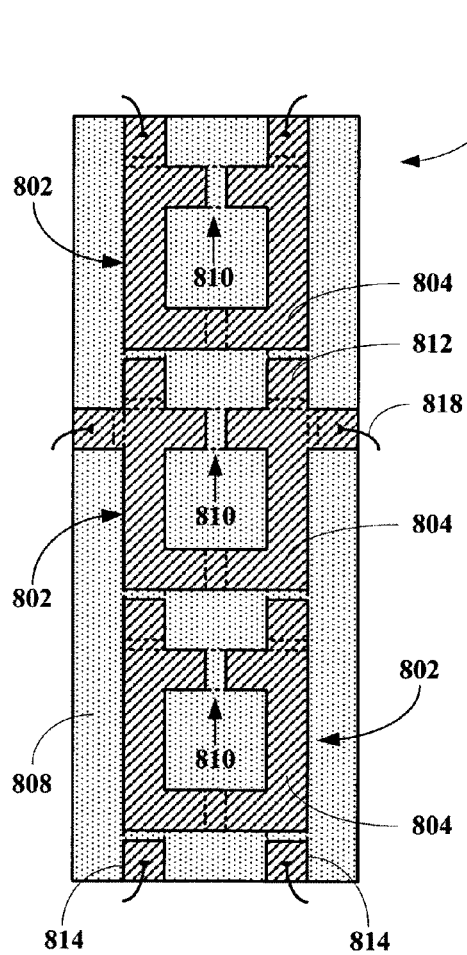
FIGS. 8A-B depict a preferred embodiment of a 1×3 array of 1 discontinuity resonators of this invention.
Figure 8B:
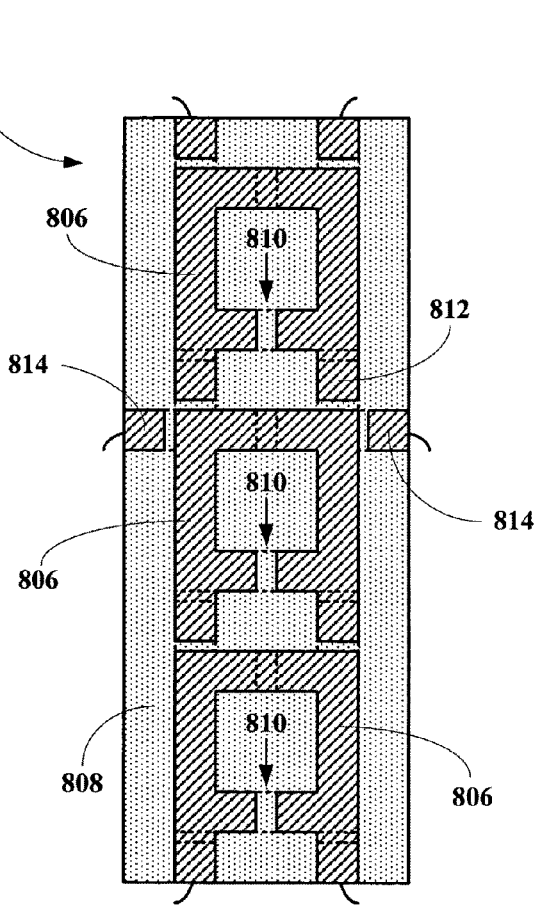

Referring now to FIGS. 8A&B, a preferred embodiment of a linear array comprising three resonators of this invention, generally 800, is shown to include a pair of resonators 802. Each resonator 802 includes a top coil 804 and an opposing bottom coil 806 with a dielectric substrate 808 extending out past the resonators 802. Each of the coils 804 and 806 has a single discontinuity 810 designed therein. The coils 804 and 806 are square shaped and include tabs 812 and islands 814 forming decoupling capacitors 816 formed thereon on each side of the discontinuities 810. Each resonators 802 also include connecting capacitors with wires 818.

Figure 7E:
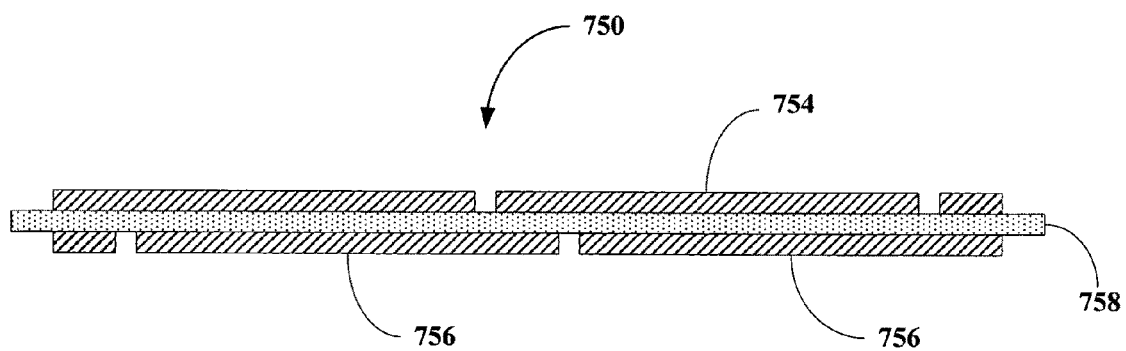
Figure 9:
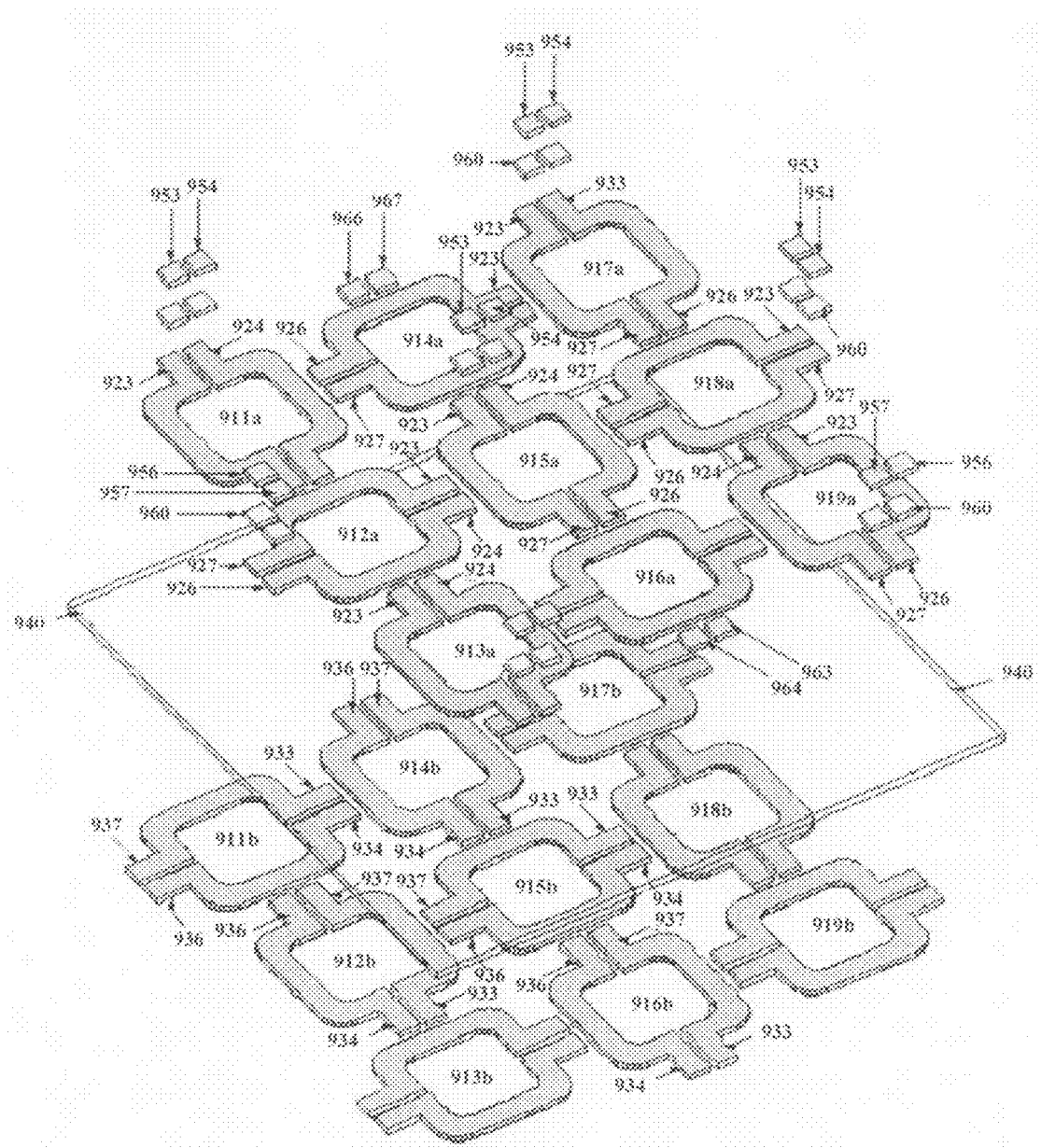
FIG. 9 depicts a preferred embodiment of a 3×3 array of 2 discontinuity resonators of this invention.

Referring now to FIG. 9, another preferred embodiment of an MRI or NMR probe of this invention, generally 900, is shown to include a non-chained, planar or array 902 of a plurality of 2 discontinuity resonators 904 formed into a 3×3 array. Each resonator 904 is made up of a 3×3 array of top coils 911a-919a having tabs 923, 924, 926 and 927 and a 3×3 array of bottom coils 911b-919b having tabs 933, 934, 936, 937 and a dielectric substrate 940 interposed therebetween. Overlapping portions of tabs 923, 924, 926, 927, 933, 934, 936, and 937 form the decoupling capacitors as shown in FIG. 7E. In the array 900, each nearest neighbor resonator may be oriented in a plane with a 90 degree offset orientation from its nearest neighbor resonators 904. Each resonator 904 also includes connecting capacitors 950 formed from dielectric layer 960 deposited on certain of the tabs 923, 924, 926 and 927 and conductive layer 953 and 954 deposited on the dielectric layer 960.

Figure 10:
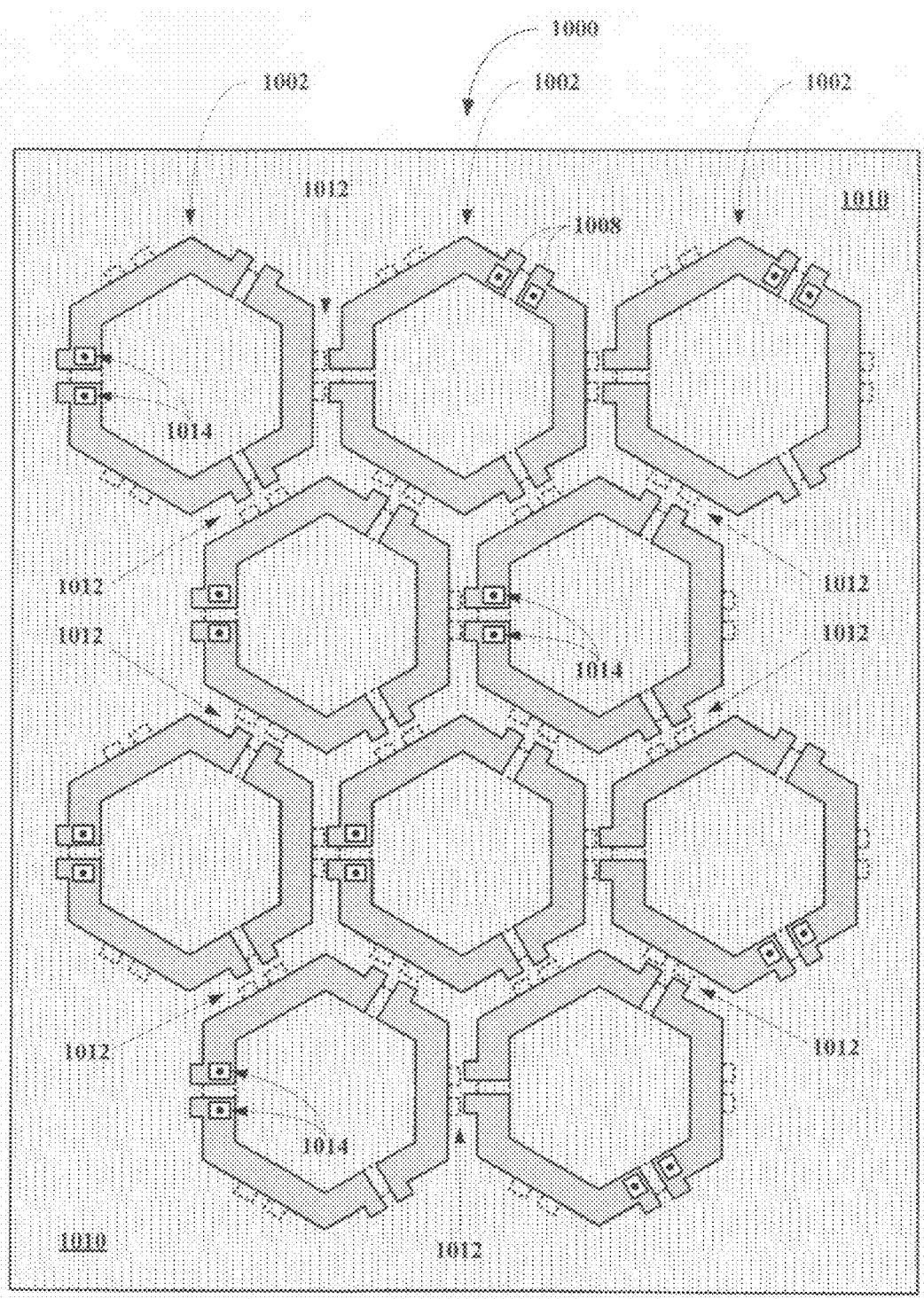
FIG. 10 depicts a preferred embodiment of a 10 resonator array of 3 discontinuity resonators of this invention.

Referring now to FIG. 10, a preferred embodiment of an array, generally 1000, of hexagonal resonators 1002. Each resonator 1002 includes top and bottom coils 1004 and 1006 having tabs 1008 formed on a dielectric substrate 1010. Again, overlapping portions of the tabs 1008 on adjacent resonators 1002 form decoupling capacitors 1012. The resonators 1002 also include connective capacitors with contact 1014 formed on the top coils 1004. Again, the resonators are preferably made out of HTS and the arrays are preferably operated at or below their $T_c$. It should be recognized that the array 1000 can also include other shaped resonators fill all portions of the rectangular surface or can be skewed so that the hexagonal packing is maximal.

Figure 11:
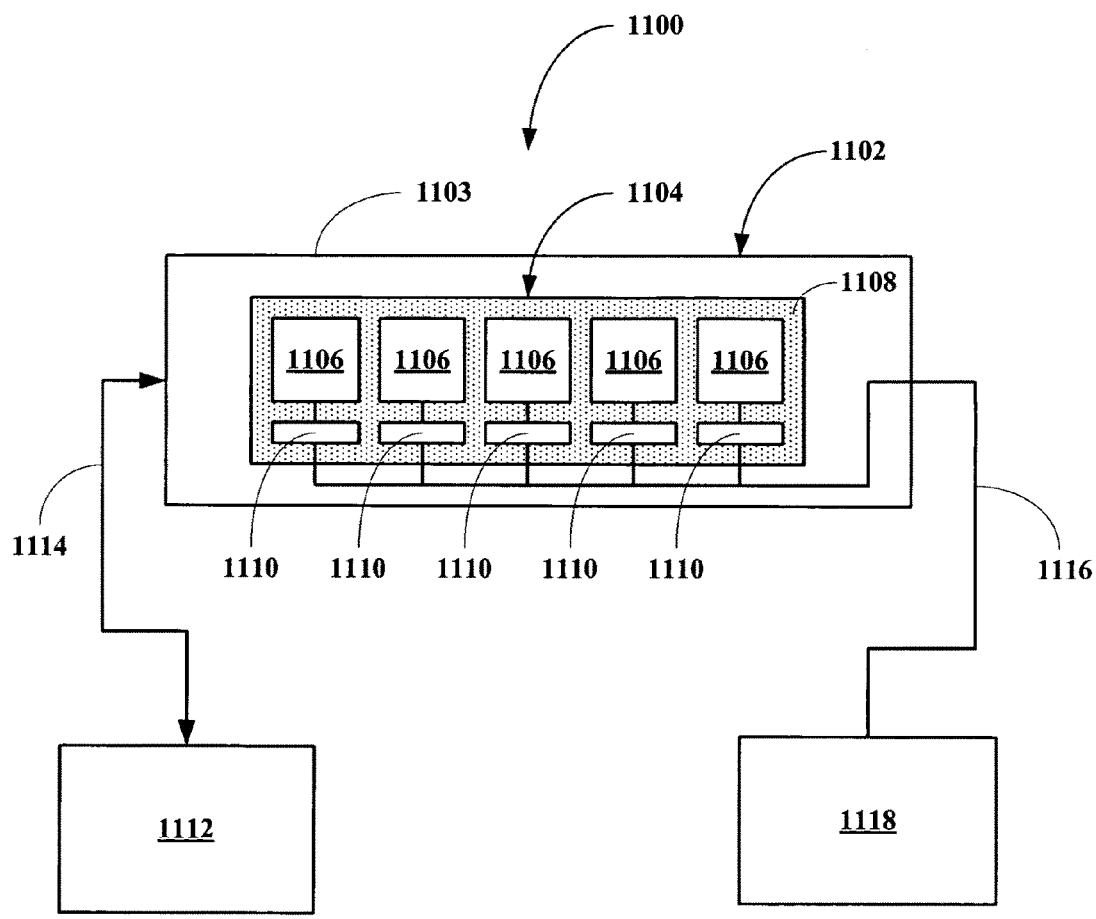
FIG. 11 depicts a preferred embodiment of probe assembly of this invention.

Referring now to FIG. 11, a preferred embodiment of an MRI probe assembly of this invention, generally 1100, is shown to include a probe 1102 having a housing 1103, an array 1104 of resonators 1106 of this invention formed on a dielectric substrate 1108 along with pre-amplifiers 1110, one for each resonator 1106. The probe assembly 1100 also include a source for cooling 1112 in thermal contact 1114 with the probe 1102 to cool the array 1104 and pre-amplifiers 1110. The outputs of the pre-amplifiers 1110 are in electrical communication 1116 with an MRI scanner unit 1118. Preferably, the cooling source 1112 a cryogenic cooling device.

Figure 12:
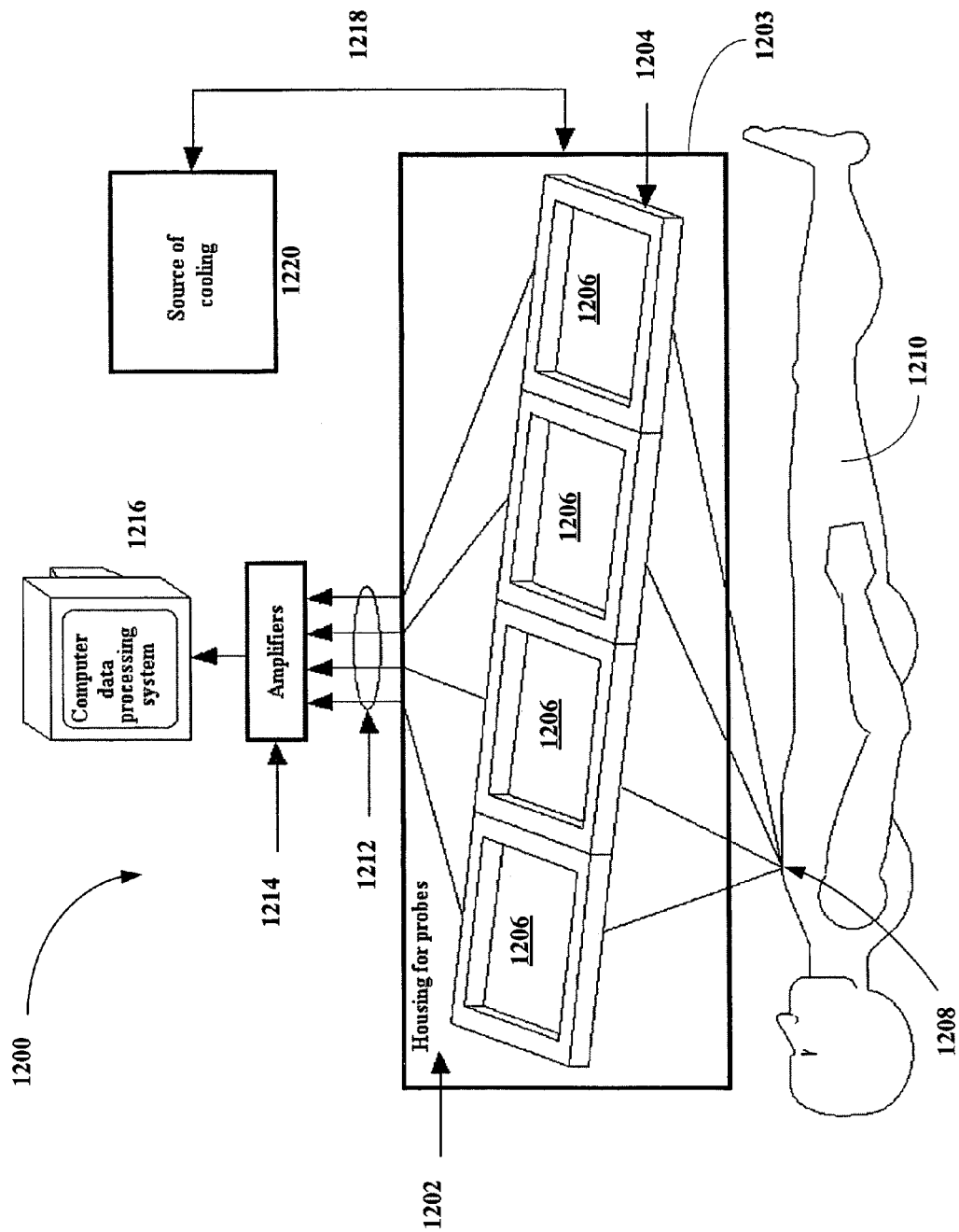
FIG. 12 depicts a preferred embodiment of an MRI device of this invention.

Referring now to FIG. 12, a preferred embodiment of an MRI apparatus of this invention, generally 1200, is shown to include a probe 1202 a housing 1203, having an array 1204 of resonators 1206 of this invention therein and positioned relative to a location 1208 on a human body 1210. Output signals from the resonators 1206 are transmitted along an output cable 1212 to an amplification unit 1214 including one amplifier for each resonator 1206. The outputs are then collected, processed and analyzed to produce an image on receiver device 1216. The probe 1202 is thermally connected via connection 1218 to a source of cooling 1220. The resonators 1206 receive NMR signals from sample body 1210 and transfer the signals to amplifier 1214. The signals may then be further communicated to external receiver 1206 where the data may be processed.

The cryogenic housing 1203 may further comprise a heat conductive holder (not shown in the figures), which fixes the array 1204 in predetermined position in cryogenic housing 1203. The heat conductive holder is made out of heat conductive material, such as copper, sapphire, and the like. The source of cooling 1220 can be a cryogenic fluid circulation system where the connection 1218 is supply and return fluid line or a cold finger where the connection 1218 is simple thermal contact.

All references cited herein are incorporated by reference. While this invention has been described fully and completely, it should be understood that, within the scope of the appended claims, the invention may be practiced otherwise than as specifically described. Although the invention has been disclosed with reference to its preferred embodiments, from reading this description those of skill in the art may appreciate changes and modification that may be made which do not depart from the scope and spirit of the invention as described above and claimed hereafter.

We claim:

1. A resonator adaptable for use in magnetoresonant imaging, comprising:
    a first resonant coil, comprising an electrically conductive material and having at least one discontinuity therein;
    a second resonant coil, comprising an electrically conductive material, having the same number of discontinuities as the first coil,
    a plurality of tabs proximate the discontinuities or a plurality of tabs and islands proximate the discontinuities adapted to form an external capacitive coupling to the resonator, and
    a dielectric substrate interposed between the first resonant coil and the second resonant coil;
    where the discontinuities in each coil are equally spaced and where the coils are arranged so that all of the discontinuities are equally spaced.

2. A resonator adaptable for use in magnetoresonant imaging, comprising:
    a dielectric substrate;
    a first resonant coil disposed on a first surface of the dielectric substrate, the first resonant coil further comprising:
        an electrically conductive material arranged as a conducting loop having a first discontinuity therein;
        a first land or tab disposed proximate a first end of the first discontinuity; and
        a second land disposed proximate a second end of the first discontinuity, where the first and second lands form a cooperative pair of lands;
    a second resonant coil disposed on a second surface of the dielectric substrate opposite the first surface of the dielectric substrate, the second resonant coil comprising:
        an electrically conductive material arranged as a conductive loop having a second discontinuity, where the second discontinuity is disposed substantially at a point furthest from the first discontinuity of the first resonant coil;
        a first land disposed proximate a first end of the second discontinuity; and
        a second land disposed proximate a second end of the second discontinuity, where the first and second lands form a second cooperative pair of lands.

3. The resonator of claim 2, wherein each land further comprises:
a contact zone, adapted to communicate an electromagnetic signal between a scanner and the resonator; and
an insulator disposed between the land and the contact zone.

4. The resonator of claim 3, wherein the contact zone comprises at least one of (i) a metal or (ii) a superconducting material.

5. The resonator of claim 3, wherein the lands are adapted to provide capacitive coupling between at least one of a scanner channel and the resonator.

6. The resonator of claim 1, wherein the coils define a predetermined shape, which is at least one of (i) a substantially parallelogram shape, (ii) a substantially circular shape, (iii) a substantially obround shape, (iv) a substantially oval shape, or (v) a substantially non-parallelogram shape.

7. A resonator adaptable for use in magnetoresonant imaging, comprising:
a dielectric substrate;
a first resonant coil disposed on a first surface of the dielectric substrate, the first resonant coil further comprising:
an electrically conductive material having first discontinuity and a second discontinuity and otherwise forming a continuous geometry defining a predetermined shape, where the second discontinuity is disposed at a position on the first resonant coil substantially maximally separated from the first discontinuity;
a first land disposed proximate a first end of the first discontinuity;
a second land disposed proximate a second end of the first discontinuity, where the first and second lands form a first pair of lands;
a third land disposed proximate a first end of the second discontinuity; and
a fourth land disposed proximate a second end of the second discontinuity, where the third and fourth lands form a second pair of lands;
a second resonant coil disposed on a second surface of the dielectric substrate opposite the first surface of the dielectric substrate, comprising
an electrically conductive material arranged in a shape substantially congruent to the shape of the first resonant coil having a first discontinuity and second discontinuity substantially maximally separated therefrom;
a first land disposed proximate a first end of the first discontinuity;
a second land disposed proximate a second end of the first discontinuity, where the first and second lands form a third pair of lands;
a third land disposed proximate a first end of the second discontinuity; and
a fourth land disposed proximate a second end of the second discontinuity, where the third and fourth lands form a fourth pair of lands.

8. The resonator of claim 7, wherein each land further comprises:
a contact zone, adapted to communicate an electromagnetic signal between scanner and the resonator; and
an insulator disposed between the land and the contact zone.

9. The resonator of claim 8, wherein the contact zone further comprises an electrically conductive material.

10. The resonator of claim 7, wherein the lands are adapted to provide capacitive coupling between at least one of (i) a source of the electromagnetic signal and the resonator or (ii) the first resonator coil and the second resonator coil.

11. The resonator of claim 7, wherein the predetermined shape is at least one of (i) a substantially parallelogram shape, (ii) a substantially circular shape, (iii) a substantially obround shape, (iv) a substantially oval shape, or (v) a substantially non-parallelogram shape.

12. A probe useful for magnetoresonant imaging, comprising:
a housing;
a resonator, disposed in the housing, the resonator adaptable for use in magnetoresonant imaging, the resonator further comprising at least one of (i) a 1 discontinuity resonator, the 1 discontinuity resonator comprising a conductive material arranged in an otherwise continuous geometry on a dielectric substrate, the otherwise continuous geometry further comprising a single discontinuity, a first land disposed proximate a first end of the discontinuity, and a second land disposed proximate a second end of the discontinuity or (ii) 2 discontinuity resonator, the 2 discontinuity resonator comprising a conductive material arranged in an otherwise continuous geometry on a dielectric substrate, the loop further comprising two discontinuities in the otherwise continuous geometry, a first land disposed proximate a first end of the first discontinuity, a second land disposed proximate a second end of the first discontinuity, a third land disposed proximate a first end of the second discontinuity, and a fourth land disposed proximate a second end of the second discontinuity; and
an amplifier adapted to receive an electromagnetic signal from the resonator and communicate that signal to an external receiver, the amplifier capacitively coupled to at least one of (i) the first resonator coil or (ii) the second resonator coil.

13. The probe of claim 12, further comprising:
a source of a cryogenic fluid; and
an inlet in the housing, the inlet in fluid communication with the source of cryogenic fluid;
wherein the conductive material is at least one of (i) a metal cooled by the cryogenic fluid or (ii) a superconducting material cooled by the cryogenic fluid.

14. The probe of claim 12, wherein the probe comprises curved profile, the curved profile comprising at least one of (i) a convex shape or (ii) a concave shape.

15. The probe of claim 12, further comprising:
the resonator is an array of resonators disposed within the housing, each resonator capacitively coupled to at least one separate amplifier, each resonator further capacitively decoupled from its nearest neighboring resonators.

16. The probe of claim 15, wherein the array of resonators is a 1×N or M×N array, where the resonators have between 1 and 6 discontinuities per coil.

17. The probe of claim 16, wherein each of the resonators in the 1×N array has at least one discontinuity.

18. The probe of claim 15, wherein the predetermined non-chained pattern comprises an M by N array of 2 discontinuity resonators, each adjacent resonator coil on a same surface of the dielectric being electrically isolated from each of its neighboring resonator coils on the same surface of the dielectric.

19. The probe of claim 18, wherein each adjacent resonator coil on a same surface of the dielectric is electrically isolated from each of its neighboring resonator coils via four pairs of lands attached to each resonator.

20. The probe of claim 15, further comprising:
a metal block, disposed within the housing, to which a predetermined number of the array of resonators is attached.

21. The probe of claim 20, wherein the metal block comprises copper.

22. A method of using a probe useful for magnetoresonant imaging, comprising:
connecting a probe to a source of cooling, the probe comprising a housing; a resonator disposed in the housing, the resonator adaptable for use in magnetoresonant imaging, the resonator further comprising at least one of (i) a 1 discontinuity resonator comprising a conductive material arranged in an otherwise continuous geometry on a dielectric substrate, the otherwise continuous geometry further comprising a single discontinuity, a first land disposed at a first end of the discontinuity, and a second land disposed at a second end of the discontinuity or (ii) 2 discontinuity resonator comprising a conductive material arranged in an otherwise continuous geometry on a dielectric substrate, the loop further comprising two discontinuities in the otherwise continuous geometry, a first land disposed at a first end of the first discontinuity, a second land disposed at a second end of the first discontinuity, a third land disposed at a first end of the second discontinuity, and a fourth land disposed at a second of the second discontinuity; and an amplifier adapted to receive an electromagnetic signal from the resonator and communicate that signal to an external receiver, the amplifier capacitively coupled to at least one of (i) the first resonator coil or (ii) the second resonator coil;
connecting the amplifier to a scanner;
using fluid from the source of cooling to cool the resonator inside the housing of the probe to a predetermined temperature; and
obtaining a measurement from the amplifier.

23. The method of claim 22, wherein the probe comprises a plurality of electromagnetically decoupled resonators, each operatively in communication with a separate amplifier; and
the probe is used to obtain real time partial parallel processing magnetic resonance imaging.

24. The method of claim 22, further comprising:
providing a plurality of resonators in the housing;
using the plurality of resonators to obtain simultaneous signals, each of the simultaneous signals being obtained from at least one of (i) a single resonator coil or (ii) a single pair of resonator coils; and
processing the simultaneous signals to create a unified view of a target under the probe.

25. The method of claim 22, wherein the probe comprises a plurality of electromagnetically decoupled resonators and integrated pre-amplifiers electrically connected to a scanner.

* * * * *